(12) United States Patent
Takaya et al.

(10) Patent No.: US 8,952,430 B2
(45) Date of Patent: Feb. 10, 2015

(54) SEMICONDUCTOR DEVICE AND METHOD FOR MANUFACTURING SEMICONDUCTOR DEVICE

(75) Inventors: Hidefumi Takaya, Toyota (JP); Hideo Matsuki, Obu (JP); Naohiro Suzuki, Anjo (JP); Tsuyoshi Ishikawa, Nisshin (JP)

(73) Assignees: Denso Corporation, Kariya-Shi (JP); Toyota Jidosha Kabushiki Kaisha, Toyota-Shi (JP)

( * ) Notice: Subject to any disclaimer, the term of this patent is extended or adjusted under 35 U.S.C. 154(b) by 0 days.

(21) Appl. No.: 13/703,284

(22) PCT Filed: Jun. 2, 2011

(86) PCT No.: PCT/JP2011/062723
§ 371 (c)(1),
(2), (4) Date: Dec. 10, 2012

(87) PCT Pub. No.: WO2011/155394
PCT Pub. Date: Dec. 15, 2011

(65) Prior Publication Data
US 2013/0075760 A1 Mar. 28, 2013

(30) Foreign Application Priority Data

Jun. 11, 2010 (JP) ................................. 2010-133800
Dec. 10, 2010 (JP) ................................. 2010-275477

(51) Int. Cl.
*H01L 29/76* (2006.01)
*H01L 29/16* (2006.01)
(Continued)

(52) U.S. Cl.
CPC ............ *H01L 29/1608* (2013.01); *H01L 29/49* (2013.01); *H01L 29/407* (2013.01);
(Continued)

(58) Field of Classification Search
CPC ..................... H01L 29/42368; H01L 29/402
USPC ......... 257/288, 329, 330, 331, 332, 334, 341, 257/E29.257, E21.334, E29.255
See application file for complete search history.

(56) References Cited

U.S. PATENT DOCUMENTS

2008/0073707 A1    3/2008  Darwish
2008/0087951 A1*   4/2008  Takaya et al. ................. 257/334

FOREIGN PATENT DOCUMENTS

| CN | 101048874 A | 10/2007 |
|----|-------------|---------|
| CN | 101546164 A | 9/2009 |
| JP | 07-507661 A | 8/1995 |
| JP | 09-283754 A | 10/1997 |
| JP | 11-307785 A | 11/1999 |

(Continued)

*Primary Examiner* — Kyoung Lee
*Assistant Examiner* — Ratisha Mehta
(74) *Attorney, Agent, or Firm* — Kenyon & Kenyon LLP

(57) ABSTRACT

The present application relates to technology for improving a withstand voltage of a semiconductor device. The semiconductor device includes a termination area that surrounds a cell area. The cell area is provided with a plurality of main trenches. The termination area is provided with one or more termination trenches surrounding the cell area. A termination trench is disposed at an innermost circumference of one or more termination trenches. A body region is disposed on a surface of a drift region. Each main trench reaches the drift region. A gate electrode is provided within each main trench. The termination trench reaches the drift region. Sidewalls and a bottom surface of the termination trench are covered with an insulating layer. A surface of the insulating layer covering the bottom surface of the termination trench is covered with a buried electrode. A gate potential is applied to the buried electrode.

16 Claims, 14 Drawing Sheets

(51) Int. Cl.
*H01L 29/49* (2006.01)
*H01L 29/40* (2006.01)
*H01L 29/739* (2006.01)
*H01L 29/06* (2006.01)
*H01L 29/66* (2006.01)
*H01L 29/78* (2006.01)
*H01L 29/423* (2006.01)

(52) U.S. Cl.
CPC ........ *H01L29/7397* (2013.01); *H01L 29/0619* (2013.01); *H01L 29/0661* (2013.01); *H01L 29/66068* (2013.01); *H01L 29/7811* (2013.01); *H01L 29/0653* (2013.01); *H01L 29/42368* (2013.01); *H01L 29/0623* (2013.01)

USPC ........... 257/288; 257/329; 257/330; 257/331; 257/332; 257/334; 257/341; 257/E29.257; 257/E21.334; 257/E29.255

(56) References Cited

FOREIGN PATENT DOCUMENTS

| | | |
|---|---|---|
| JP | 2001-015744 A | 1/2001 |
| JP | 2001-358338 A | 12/2001 |
| JP | 2003-505886 A | 2/2003 |
| JP | 2004-006723 A | 1/2004 |
| JP | 2006-128507 A | 5/2006 |
| JP | 2008-118011 A | 5/2008 |
| WO | 2009/102651 A2 | 8/2009 |

\* cited by examiner

SEMICONDUCTOR DEVICE AND METHOD FOR MANUFACTURING SEMICONDUCTOR DEVICE This is a 371 national phase application of PCT/JP2011/062723 filed 2 Jun. 2011, which claims priority of Japanese Patent Applications No. 2010-133800 filed in Japan on 11 Jun. 2010, and No. 2010-275477 filed in Japan on 10 Dec. 2010, the contents of which are incorporated herein by reference.

TECHNICAL FIELD

This application claims priority to Japanese Patent Application No. 2010-133800 filed on 11 Jun. 2010 and Japanese Patent Application No. 2010-275477 filed on 10 Dec. 2010, the contents of which are hereby incorporated by reference into the present application. The present application relates to technology for improving a withstand voltage of a semiconductor device. In particular, the present application relates to technology for a semiconductor device using silicon carbide (hereinafter, abbreviated to SiC), whereby the withstand voltage can be raised in a semiconductor device having a cell area in which a semiconductor structure (for example, a MOSFET structure, an IGBT structure of a diode structure, etc.) is constructed, and a termination insulating region (termination area) which surrounds and broadens from the cell area.

BACKGROUND ART

Progress has been made in technology for constructing a semiconductor structure (MOSFET, IGBT, diode, etc.) which functions as a semiconductor device on a semiconductor substrate in which a body region of a first conductive type (for example, p type) is disposed onto a surface of a drift region of a second conductive type (for example, n type). In a semiconductor device of this type, it is known that the withstand voltage of a semiconductor device is raised by forming a termination insulating region (termination area) which surrounds the cell area on the outer side of the range (cell area) where a semiconductor structure functioning as a MOSFET, IGBT, diode, or the like, is constructed.

Furthermore, a field plate structure is known as technology for raising the withstand voltage of the semiconductor device. In a general field plate structure, a conductor portion is formed on a surface of a semiconductor via an insulating film. By extending a depletion layer formed in the semiconductor and preventing the concentration of an electric field by adopting a field plate structure, it is possible to raise the withstand voltage of the semiconductor device.

Furthermore, an FLR (Field Limiting Ring) structure is known as separate technology for raising the withstand voltage of the semiconductor device. In an FLR structure, the FLR is formed in a ring shape on the outer side of the cell area. In a general FLR structure, the outer circumference portion of the cell area forms a drift region of a second conductive type. A structure is adopted in which a region of a first conductive type is formed by diffusion inside the drift region in the outer circumference portion. By using an FLR structure, it is possible to broaden the depletion layer, which extends from the circumference edge portion of the cell area, to the outer side of the FLR. Therefore, it is possible to prevent concentration of the electric field in the termination region of the cell area, which leads to decline in the withstand voltage characteristics of the semiconductor device.

The following patents have been disclosed in relation to the technology described above: Japanese Patent Application Publication No. 2001-15744, Japanese Patent Application Publication No. H11-307785, Japanese Patent Application Publication No. 2004-6723, Japanese Patent Application Publication No. H9-283754, and Japanese Patent Application Publication No. 2001-358338.

SUMMARY OF INVENTION

Technical Problem

SiC has low relative permittivity compared to Si. Therefore, in a semiconductor device using SiC, the depletion layer is not liable to broaden, and hence it is difficult to obtain beneficial effects in improving the withstand voltage with a general field plate structure in which a conductor portion is formed on the surface of a semiconductor via an insulating film.

Furthermore, SiC has a low impurity diffusion coefficient compared to Si. Therefore, it is difficult to form an FLR structure using diffusion in a semiconductor device based on SiC. Moreover, in a general semiconductor device based on SiC, the body region is formed by epitaxial growth, and therefore the body layer is formed over the whole surface of the wafer. Consequently, a body region is also formed on the outer circumference portion of the cell area. In this case, it is difficult to adopt a general FLR structure in which a region of a first conductive type is formed by diffusion in a drift region of a second conductive type.

The technology according to the present application has been proposed in order to resolve the problems described above. More specifically, the present application provides a novel voltage withstanding structure capable of increasing the withstand voltage, even in a semiconductor device provided with a cell area and a termination area, in which it is difficult to increase the withstand voltage by a field plate structure or FLR structure.

Solution to the Technical Problem

A semiconductor device disclosed in the present application may use SiC as a semiconductor substrate. The semiconductor device disclosed in the present application may comprise a semiconductor substrate including a cell area and a termination area that surrounds the cell area. The cell area may be provided with a plurality of main trenches. The termination area may be provided with one or more termination trenches surrounding the cell area. The one or more termination trenches may comprise a first termination trench, which is disposed at an innermost circumference. In an inner region of the first termination trench, a first conductive type body region may be disposed on a surface of a second conductive type drift region. Each main trench may penetrate the body region from a surface of the semiconductor substrate and reach the drift region. A gate electrode may be provided within each main trench. The first termination trench may penetrate the body region from the surface of the semiconductor substrate and reach the drift region. Sidewalls and a bottom surface of the first termination trench may be covered with a first insulating layer. The first insulating layer may include at least a covering portion disposed on the bottom surface of the first termination trench. At least a part of a surface of the covering portion may be covered with a conductive layer. A particular potential may be applied to the conductive layer at least during when no on-potential is applied to the gate electrodes. The particular potential may be equal to a potential applied to the gate electrodes or a source electrode when no on-potential is applied to the gate electrodes.

The conductive layer is formed via the first insulating layer on at least a portion of the bottom surface of the first termination trench. Consequently, a field plate structure is formed on the bottom surface of the trench. In other words, a buried type field plate is formed in the outer circumference portion of the cell area. Furthermore, the first termination trench penetrates the body region from the surface of the semiconductor substrate and reaches the drift region. Therefore, the field plate is formed in the vicinity of the drift region rather than the surface of the semiconductor substrate. Accordingly, it is possible to form a field plate in the vicinity of the region where it is desired to broaden the depletion layer.

A particular potential which is equal to a potential applied to the gate electrodes or source electrode is applied to the conductive layer of the buried type field plate at least while no on-potential is applied to the gate electrodes. Therefore, beneficial effects in preventing concentration of the electric field by extending the depletion layer formed in the semiconductor are obtained by the field plate, and the withstand voltage in the vicinity of the termination portion of the cell area is increased.

If SiC is used as the semiconductor substrate, then the band gap is larger than with Si, and therefore the relative permittivity is low and the depletion layer is not liable to broaden. Accordingly, it is difficult to obtain the beneficial effects of the field plate as with Si, even if a field plate structure is provided on the surface of the semiconductor substrate. However, even though it is difficult to broaden the depletion layer by forming a buried type field plate, the beneficial effects of the field plate can be obtained satisfactorily. Therefore, the withstand voltage in the termination portion of the semiconductor device can be guaranteed.

In the semiconductor device disclosed in the present application, the termination area may be provided with a plurality of termination trenches surrounding the cell area. The plurality of termination trenches may comprise a first termination trench and one or more second termination trenches. The first termination trench may be disposed on the innermost circumference. The one or more second termination trenches may be disposed on an outer circumference side of the first termination trench. In an outer region of the first termination trench, the first conductive type body region may be disposed on a surface of the second conductivity type drift region. Each second termination trench surrounds the outer circumference of the first termination trench, may be narrower than the first termination trench, may penetrate the body region from a surface of the body region, and may reach the drift region. An insulator may fill inside of each second termination trench.

In the termination area, if a body region is disposed on the surface of the drift region, then it is necessary to separate the termination area electrically. An example of a structure in which a body region is disposed on the surface of a drift region in the termination area also is one where a body region is formed on the whole surface of the semiconductor substrate by epitaxial growth. Each second termination trench surrounds the outer circumference of the first termination trench, penetrates the body region from a surface of the body region and reaches the drift region. Furthermore, an insulator region fills inside each second termination trench. Therefore, it is possible to separate the termination area electrically by the insulator which fills the second termination trench.

Moreover, by forming the second trench, a region of a first conductive type is left surrounding the outer circumference of the first termination trench in a ring shape. In this case, it is possible to use the region of a first conductive type which is left in a ring shape, as an FLR. Consequently, it is still possible to form an FLR even with a structure in which a body region is disposed on the surface of the drift region in the termination area. Therefore, since the electric field can be diminished in the termination portion of the cell area by the FLR, it is possible to guarantee the withstand voltage of the termination portion more reliably.

The semiconductor device disclosed in the present application may comprise a second insulating layer covering a bottom surface of each main trench. A thickness of a portion covering the bottom surface of the first insulating layer may be thinner than a thickness of the second insulating layer. By altering the thickness of the insulating layer in this way, it is possible to bury the oxide film and form the termination portion simultaneously.

In each main trench, the gate electrode may be formed above the second insulating layer. In the first termination trench, the conductive layer may be formed above the first insulating layer. A thickness of a portion covering the bottom surface of the first insulating layer may be thinner than a thickness of the second insulating layer. Accordingly, it is possible to form a field plate structure at a deeper position than the gate electrode. Consequently, the field plate can be positioned in closer proximity to the region where it is desired to broaden the depletion layer and therefore the beneficial effects of the field plate can be obtained more effectively.

The semiconductor device disclosed in the present application may further comprise a semiconductor region and a contact region. The semiconductor region may be formed in a region exposed at the surface of the semiconductor substrate, may be a second conductive type region, may be disposed adjacent to the main trenches, and may be separated from the drift region by the body region. The contact region may be formed at a surface of the body region, and may electrically connect with the semiconductor region. No contact region may be formed at an outer region of a region surrounded by the first termination trench.

A contact region is not formed on the outer side of the region which is surrounded by the first termination trench. Consequently, the body region which is positioned on the outer side of the first termination trench is not connected to any electrode. Accordingly, the termination area can be placed in a floating state which is insulated from the periphery.

In the semiconductor device disclosed in the present application, a depth of the first termination trench may be identical to a depth of the second termination trenches. Therefore, the first termination trench and the second termination trenches can be formed simultaneously in the same process. Consequently, it is possible to omit manufacturing steps for a semiconductor device.

In the semiconductor device disclosed in the present application, a first distance between the first termination trench and a termination trench adjacent to the first termination trench may be smaller than a second distance between the first termination trench and a main trench adjacent to the first termination trench. Since a contact region is not formed in the region between the first termination trench and the adjacent termination trench, the depletion layer formed in the semiconductor is not liable to broaden. On the other hand, since the contact region is formed in the region between the first termination trench and the main trenches, the depletion layer formed in the semiconductor is liable to broaden. Therefore, by making the first distance smaller than the second distance, the depletion layer can be broadened more readily and the withstand voltage of the termination area can be increased.

In the semiconductor device disclosed in the present application, a third insulating layer may cover an upper portion of each main trench. The conductive layer may include aluminum. The conductive layer continuously may cover a surface of the first insulating layer covering the bottom surface and the sidewalls of the first termination trench, a surface of the body region being present in the inner region of the first termination trench, and a surface of the third insulating layer covering the main trenches. A potential being equal to a potential applied to the source electrode may be applied to the conductive layer. Since the conductive layer is formed via the first insulating layer on the bottom surface of the first termination trench, a field plate structure is formed. The conductive layer also functions as a source electrode. A potential equal to the potential applied to the source electrode is applied to the conductive layer. The potential applied to the source electrode is generally a stable potential (ground potential, etc.). Therefore, the beneficial effects of the field plate can be further stabilized compared to a case where the potential applied to the gate electrodes is applied to the conductive layer.

In the semiconductor device disclosed in the present application, a thickness of the first insulating layer covering an outer circumference side of the sidewalls of the first termination trench may be thicker than a thickness of the first insulating layer covering an inner circumference side of the sidewalls and the bottom surface of the first termination trench. If a potential equal to the potential applied to the gate electrodes is applied to the conductive layer when the semiconductor device is off, then an electric field concentrates in the first insulating layer which covers the outer circumference side of the sidewalls of the first termination trench. In the semiconductor device disclosed in the present application, it is possible to diminish the electric field intensity in the outer circumference side of the sidewall portions of the first termination trench by making the film thickness of the first insulating layer thicker in this portion. Consequently, it is possible to increase the withstand voltage of the termination area. Moreover, the greater the thickness of the first insulating layer, the greater the stress which is generated in the portion covered by the first insulating layer. In the semiconductor device disclosed in the present application, the thickness of the first insulating layer is thinner in the inner circumference side of the sidewalls and the bottom surface portion of the first termination trench. Therefore, compared to a case where the thickness of the whole of the insulating layer covering the sidewalls and the bottom surface of the first termination trench is made thicker, it is possible to reduce the stress generated in the inner circumference side of the sidewalls and the bottom surface of the first termination trench.

In the semiconductor device disclosed in the present application, the first insulating layer may comprise a lower layer insulating layer and an upper layer insulating layer. The lower layer insulating layer may cover the sidewalls and the bottom surface of the first termination trench. The conductive layer may be provided with a first end portion. The conductive layer may be formed at an inner region of the first end portion. When the semiconductor device is observed from vertically above the semiconductor substrate, the first end portion may be positioned on an inner circumference of a surface position of the first insulating layer covering an outer circumference side of the sidewalls of the first termination trench. The upper layer insulating layer may cover a surface of the lower layer insulating layer covering the sidewalls of the first termination trench, a surface and sidewalls of the conductive layer covering the surface of the lower layer insulating layer, and a surface of the lower layer insulating layer covering the bottom surface of the first termination trench at an outer region of the first end portion. One example of the lower layer insulating layer is an insulating layer which covers a main trench, for example. One example of the upper layer insulating layer is an interlayer insulating film which is formed between the substrate and the wiring. In the semiconductor device disclosed in the present application, the upper layer insulating layer covers the sidewalls of the first end portion of the conductive layer and the outer circumference side of the sidewalls of the first termination trench. Accordingly, the thickness of the insulating layer present between the first end portion of the conductive layer and the outer circumference side of the sidewalls of the first termination trench is made thicker by the covering of the upper layer insulating layer. Therefore, since the thickness of the insulating layer is made thicker in the portion where the electric field concentrates, then it is possible to diminish the electric field intensity.

In the semiconductor device disclosed in the present application, a distance between a surface of the lower layer insulating layer covering an outer circumference side of the sidewalls of the first termination trench and the first end portion of the conductive layer may be a distance in which a region between the surface of the lower layer insulating layer covering the outer circumference side of the sidewalls of the first termination trench and the first end portion of the conductive layer is filled without any voids by the upper layer insulating layer covering the conductive layer. Since the conductive layer does not cover between the surface of the first insulating layer which covers the outer circumference side of the sidewalls of the first termination trench, and the first end portion of the conductive layer, there are cases where a trench-shaped region is formed. In the semiconductor device disclosed in the present application, this trench-shaped region is covered in a state without any voids, when covered by the upper layer insulating layer. Therefore, it is possible to further increase the beneficial effects of diminishing the electric field intensity.

In the semiconductor device disclosed in the present application, the distance between the surface of the lower layer insulating layer covering the outer circumference side of the sidewalls of the first termination trench and the first end portion of the conductive layer may be twice a thickness of the upper layer insulating layer covering the conductive layer. In an ideal upper layer insulating layer, the thickness of the upper layer insulating layer which covers the conductive layer is equal to the thickness of the upper layer insulating layer which covers the outer circumference side of the sidewalls of the first termination trench and the first end portion of the conductive layer. Therefore, in the semiconductor device disclosed in the present application, it is possible to achieve a state without any voids, when the region between the surface of the first insulating layer which covers the outer circumference side of the sidewalls of the first termination trench and the first end portion of the conductive layer is covered by the upper layer insulating layer.

In the semiconductor device disclosed in the present application, a third insulating layer may cover an upper portion of each main trench. The conductive layer may include aluminum. The conductive layer may be provided with a first end portion. The conductive layer may be disposed in an inner region of the first end portion. When the semiconductor device is observed from vertically above the semiconductor substrate, the first end portion may be positioned on an inner circumference of a surface position of the first insulating layer covering an outer circumference side of the sidewalls of the first termination trench. The conductive layer continuously may cover a surface of the first insulating layer covering the bottom surface and sidewalls of the first termination trench, a surface of the body region being present in inner region of the first termination trench, and a surface of the third insulating layer covering the main trenches. A potential being equal to a potential applied to the source electrode may be applied to the conductive layer. A fourth insulating layer may cover a surface of the first insulating layer covering the sidewalls of the first termination trench, a surface and sidewalls of the conductive layer covering the surface of the first insulating layer, and a surface of the first insulating layer covering the bottom surface of the first termination trench at an outer region of the first end portion. Since the conductive layer is formed via the first insulating layer on the bottom surface of the first termination trench, a field plate structure is formed. The conductive layer also functions as the source electrode. The potential applied to the source electrode is generally a stable potential (ground potential, etc.), and therefore it is possible to further stabilize the beneficial effects of the field plate. Furthermore, in the semiconductor, device disclosed in the present application, the fourth insulating layer covers the sidewalls of the first end portion of the conductive layer and the outer circumference side of the sidewalls of the first termination trench. Accordingly, the thickness of the insulating layer present between the first end portion of the conductive layer and the outer circumference side of the sidewalls of the first termination trench is made thicker by the covering of the fourth insulating layer. Therefore, since the thickness of the insulating layer is made thicker in the portion where the electric field concentrates, then it is possible to diminish the electric field intensity.

In the semiconductor device disclosed in the present application, a distance between a surface of the first insulating layer covering an outer circumference side of the sidewalls of the first termination trench and the first end portion of the conductive layer may be a distance in which a region between a surface of the first insulating layer covering the outer circumference side of the sidewalls of the first termination trench and the first end portion of the conductive layer is filled without any voids by the fourth insulating layer covering the conductive layer. Since the conductive layer does not cover between the surface of the first insulating layer which covers the outer circumference side of the sidewalls of the first termination trench, and the first end portion of the conductive layer, there are cases where a trench-shaped region is formed. In the semiconductor device disclosed in the present application, this trench-shaped region is covered in a state without any voids, when covered by the fourth insulating layer. Therefore, it is possible to further increase the beneficial effects of diminishing the electric field intensity.

In the semiconductor device disclosed in the present application, a second end portion of the conductive layer may be formed at the surface of the semiconductor substrate and near an opening portion of the first termination trench. When the semiconductor device is observed from vertically above the semiconductor substrate, the second end portion of the conductive layer disposed on an outer region of the first termination trench may be positioned on an inner circumference of an outer circumference side of the sidewalls of the first termination trench. The electric field generated in the conductive layer is applied to the first insulating layer which covers the sidewalls of the first termination trench. In this case, the thickness of the first insulating layer in the region where the electric field is applied is equal to the depth of the first termination trench and is a large thickness. Therefore, it is possible to raise the withstand voltage of the termination area, since the concentration of electric field in the first insulating layer can be diminished.

In the semiconductor device disclosed in the present application, a first conductive type first diffusion layer may be formed on at least a part of the drift region disposed on the bottom surface of the first termination trench. Consequently, the depletion layer at the PN junction between the first diffusion layer and the drift region extends greatly to the drift region side. Therefore, a high voltage is not liable to enter into the first insulating layer which covers the sidewalls of the first termination trench. This means that the concentration of electric field in the first insulating layer that covers the sidewalls of the first termination trench can be diminished.

The semiconductor device disclosed in the present application may further comprise a plurality of the second termination trenches. A first conductive type second diffusion layer may be formed on at least a part of the drift region disposed between adjacent second termination trenches. By forming a plurality of second termination trenches, the region of a first conductive type that is left in a ring shape is used as an FLR. Since the second diffusion layer is formed between the second termination trenches, then the depletion layer at the PN junction between the second diffusion layer and the drift region extends to the drift region side. Consequently, it is possible to further enhance the beneficial effects of broadening the depletion layer which extends from the circumference edge portion of the cell area, to the outer side of the FLR. Therefore, it is possible to more reliably ensure the withstand voltage of the termination portion.

In the semiconductor device disclosed in the present application, the first diffusion layer may comprise a third end portion. The first diffusion layer may be formed at an inner region of the third end portion. When the semiconductor device is observed from vertically above the semiconductor substrate, the third end portion may be positioned on an outer circumference side of the outer circumference side of the sidewalls of the first termination trench. An electric field concentrates in a corner portion, which is a junction portion between the bottom surface of the first termination trench and the outer circumference side of the sidewalls of the first termination trench. In the semiconductor device disclosed in the present embodiment, it is possible to form a first diffusion layer so as to cover this corner portion. Therefore, the concentration of the electric field in the corner portion of the first termination trench can be diminished.

In the semiconductor device disclosed in the present application, the first diffusion layer may comprise a fourth end portion. The first diffusion layer may be formed at an outer region of the fourth end portion. When the semiconductor device is observed from vertically above the semiconductor substrate, the fourth end portion may be positioned on an outer circumference side of the inner circumference side of the sidewalls of the first termination trench. If the first diffusion layer is formed so as to make contact with the body regions which are located in a region to the inner circumference side of the first termination trench, then the depletion layer extends starting from the first diffusion layer. In this case, it is not possible sufficiently to obtain the beneficial effects of extending the depletion layer formed in the semiconductor, by the field plate. In the semiconductor device disclosed in the present application, the fourth end portion of the first diffusion layer is positioned to the outer circumference side of the position of the inner circumference side of the sidewalls of the first termination trench. Therefore, it is possible to prevent situations where the first diffusion layer is formed in contact with the body regions located in the region to the inner circumference side of the first termination trench. Therefore, it is possible sufficiently to obtain the beneficial effects of the field plate.

A method for manufacturing a semiconductor device disclosed in the present application is a method for manufacturing a semiconductor device including a cell area and a termination area that surrounds the cell area, on a semiconductor substrate including a first conductive type body region disposed on a surface of a second conductive type drift region. A semiconductor substrate including a cell area and a termination area that surrounds the cell area may be provided. The cell area may be provided with a plurality of main trenches. The termination area may be provided with one or more termination trenches surrounding the cell area. The one or more termination trenches may comprise a first termination trench, which is disposed at an innermost circumference. In an inner region of the first termination trench, a first conductive type body region may be disposed on a surface of a second conductive type drift region. The method may comprise a trench forming process that forms the plurality of main trenches in the cell area, and the one or more termination trenches surrounding the cell area. An insulating layer forming process that forms an insulating layer on a surface of the semiconductor substrate, the thickness of the insulating layer being a predetermined value. The method may comprise an etching process that selectively etches the insulating layer disposed in the cell area by a predetermined amount. The method may comprise a conductive layer forming process that selectively forms a conductive layer within each main trench and the first termination trench. The plurality of main trenches may penetrate the body region from a surface of the semiconductor substrate and reach the drift region. The semiconductor substrate may include a first conductive type body region disposed on a surface of a second conductive type drift region. The one or more termination trenches may penetrate the body region from the surface of the semiconductor substrate and reaches the drift region.

In the trench forming process, main trenches and one or a plurality of termination trenches are formed simultaneously. In the insulating film forming process, an insulating film is formed inside both the main trenches and the termination trenches. In the etching process, a predetermined amount of the insulating film in the main trenches is removed. The predetermined amount is an amount whereby a lower end surface of the conductive layer which is buried in the main trenches in the conductive layer forming step described below is positioned in the vicinity of an interface between the drift region and the body region. In the conductive layer forming step, a conductive layer is formed inside both the main trenches and the first termination trench. Therefore, an electrode is formed in the main trenches, and a buried field plate structure is formed on the bottom surface of the first termination trench.

Consequently, it is possible to form a buried type field plate in the termination area by using the same process as the step for forming main trenches in which an electrode is buried, in the cell area. Therefore, since it is not necessary to provide a special process for forming a buried type field plate, then the manufacturing process for the semiconductor device can be simplified.

In the method for manufacturing the semiconductor device disclosed in the present application, the trench forming process may form the first termination trench and a second termination trench. The second termination trench may surround an outer circumference of the first termination trench, have a narrower width than the first termination trench, penetrate the body region from a surface of the body region, and reach the drift region. A predetermined thickness of the insulating layer formed in the insulating layer forming process may be a thickness by which the second termination trench is fully filled by the insulating layer and the first termination trench is not fully filled by the insulating layer.

Main trenches, a first termination trench and a second termination trench are formed simultaneously by the trench forming process. Insulating films are formed in the main trenches, the first termination trench and the second termination trench by the insulating film forming process. The width of the second termination trench is narrower than the first termination trench. Therefore, if the predetermined thickness of the insulating film is a thickness by which the second termination trench is fully filled by the insulating film and the first termination trench is not fully filled by the insulating layer, then it is possible to form the second termination trench which is filled by the insulating film and the first termination trench having an insulating film formed on the sidewalls and the bottom surface, simultaneously in one insulating film forming process. Therefore, it is possible to separate the termination area electrically by the insulating region which fills the second termination trench. Thus, it is possible to use the region of a first conductive type which is left in a ring shape in the termination area, as an FLR. Furthermore, since it is not necessary to provide a special process for forming the second termination trench, then the manufacturing process for the semiconductor device can be simplified.

DETAILED DESCRIPTION OF INVENTION

Figure 1:
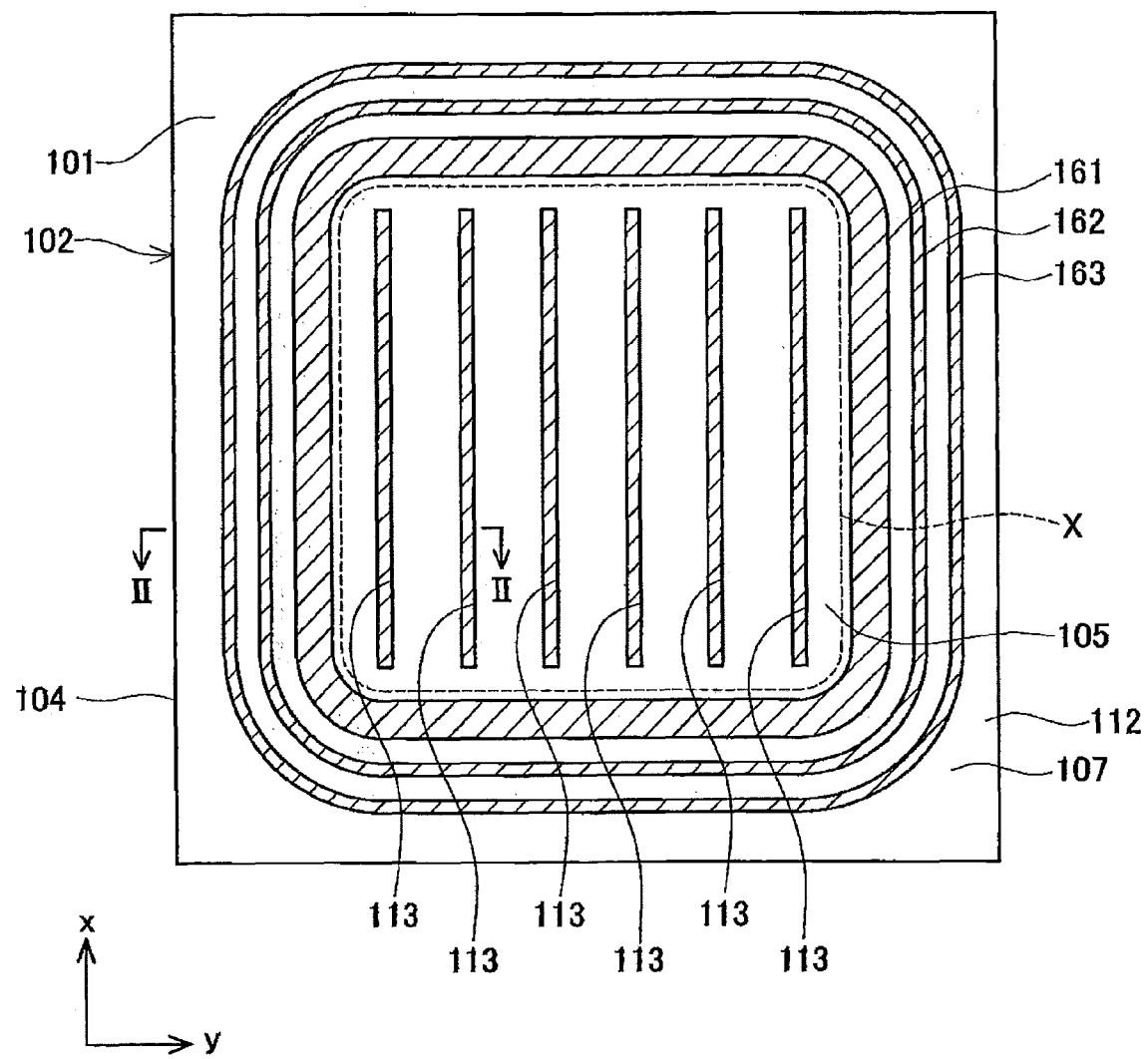
FIG. 1 is a plan diagram of a semiconductor device according to a first embodiment of the present application.

The principal characteristics of the embodiments described below are listed here.

(Characteristic 1) The semiconductor structure formed in the cell area is a MOSFET structure.

(Characteristic 2) The semiconductor structure formed in the cell area is an IGBT structure.

(Characteristic 3) A body layer of a first conductive type is formed by epitaxial growth. SiC has a low impurity diffusion coefficient compared to Si, and therefore it is difficult to form a body layer by diffusion of impurities. Consequently, it is desirable to form the body layer by epitaxial growth. Therefore, since a body region is formed over the whole surface of the semiconductor substrate, in a termination area, a body region is disposed on a surface of a drift region.

(Characteristic 4) The conductive layer is polysilicon or aluminum. Polysilicon or aluminum are general materials for forming a gate electrode. Therefore, it is possible to carry out a gate electrode forming process and a conductive layer forming process simultaneously in a common process. Consequently, it is possible to simplify manufacturing processes for a semiconductor device.

(Characteristic 5) A second diffusion layer is separated from the body region which is disposed on the surface of the drift region. Consequently, it is possible to form the second diffusion layer at a deeper position in the drift region, compared to a case where the second diffusion layer is in contact with the body region. In so doing, a depletion layer at the PN junction between the second diffusion layer and the drift region can be extended further to the drift region side. Therefore, it is possible to further enhance the beneficial effects of broadening the depletion layer which extends from the circumference edge portion of the cell area, to the outer side of the FLR.

(Characteristic 6) A first distance between a first termination trench and a termination trench which is adjacent to the first termination trench is smaller than a third distance between mutually adjacent main trenches. In the region between the first termination trench and the termination trench adjacent to same, the depletion layer formed in the semiconductor is not liable to broaden compared to the region between mutually adjacent main trenches. Therefore, by making the first distance smaller than the third distance, the depletion layer can be broadened more readily and the action of the FLR can be displayed more effectively.

(Characteristic 7) A third diffusion layer of a first conductive type is formed in at least a portion of the drift region present between a first termination trench and a second termination trench which is adjacent to the first termination trench, and the third diffusion layer is separated from the first diffusion layer. Since the third diffusion layer is formed, then the depletion layer at a PN junction between the third diffusion layer and the drift region extends to the drift region side.

Consequently, it is possible to further enhance the beneficial effects of broadening the depletion layer which extends from the circumference edge portion of the cell area, to the outer side of the FLR. Consequently, it is possible to more reliably ensure the withstand voltage of the termination portion.

(First Embodiment)

Figure 2:
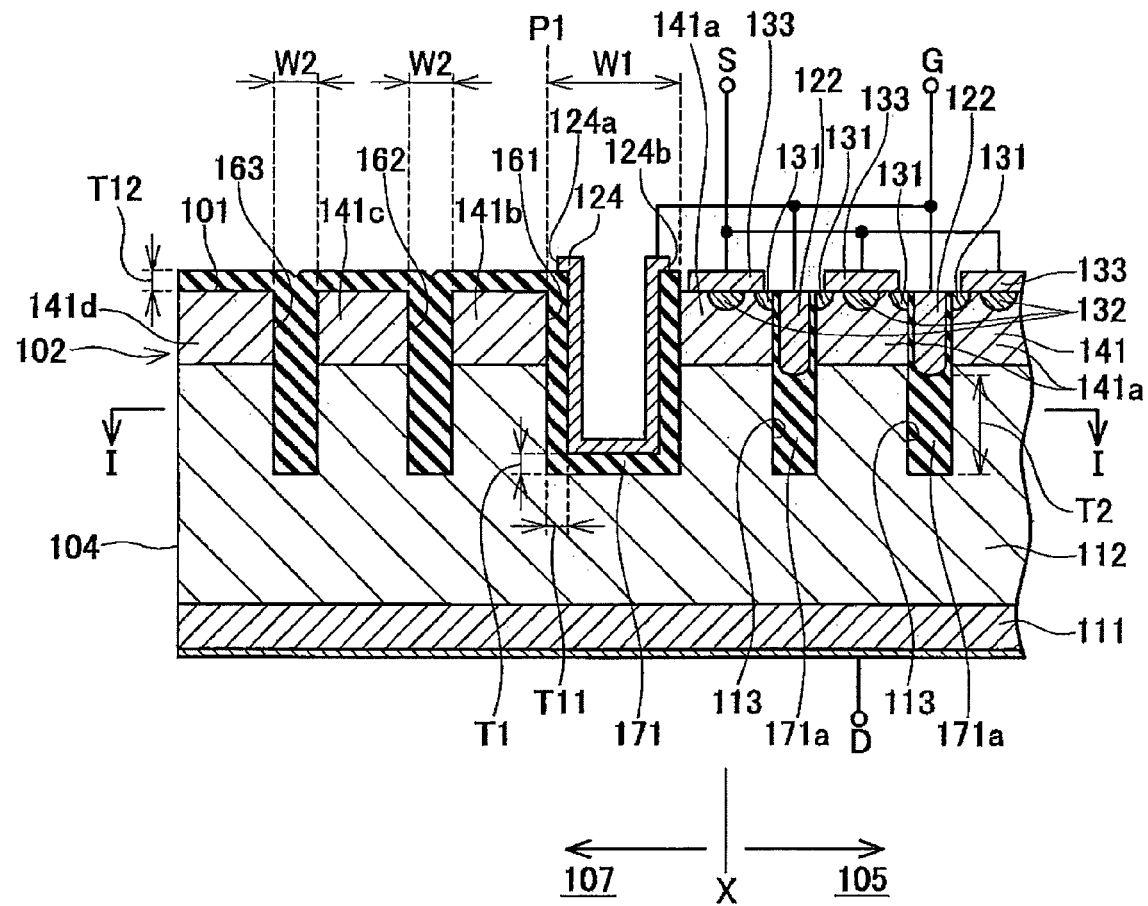
FIG. 2 is a cross-sectional diagram along line II-II in FIG. 1.

Below, a first embodiment of the semiconductor device which is a practical realization of the present teaching is described in detail with reference to the drawings. FIG. 1 is a plan diagram of the semiconductor device 100 according to the first embodiment. FIG. 2 is a cross-sectional diagram along line II-II in FIG. 1. More specifically, FIG. 1 corresponds to a cross-sectional diagram along line I-I in FIG. 2. In FIG. 1, the hatching relating to the drift region 112 is omitted.

As shown in FIG. 1, the semiconductor device 100 is manufactured by using a semiconductor substrate 102 having an outer circumference 104. The semiconductor substrate 102 is divided into a cell area 105 (inside the frame X indicated by the dotted lines in FIG. 1) in which a semiconductor structure performing a transistor operation is constructed, and a termination area 107 which surrounds this cell area 105.

The cell area 105 is formed in such a manner that six main trenches 113 extend in the up/down direction in FIG. 1. The number of main trenches 113 is not limited to six and may be set to any desired number. Three termination trenches 161 to 163 extending along the outer circumference 104 are formed to the inner side of the outer circumference 104 in the termination area 107. The termination trenches 161 to 163 are formed as closed loops which encircle the whole of the cell area 105 along the outer circumference 104.

The internal structure of the semiconductor device 100 is now described with reference to FIG. 2. The semiconductor device 100 is a semiconductor device in which silicon carbide (hereinafter called SiC) is used. As shown in FIG. 2, the semiconductor substrate 102 is formed by sequentially disposing from the rear surface side towards the surface side (from the lower side to the upper side in FIG. 2) an n+ drain region 111, an n–drift region 112 and a p– body region 141. SiC has a low impurity diffusion coefficient compared to Si, and therefore it is difficult to form a body region 141 by impurity diffusion. Consequently, the body region 141 is formed by epitaxial growth. In epitaxial growth, a body region 141 is formed over the whole surface of the semiconductor substrate 102. Therefore, in the termination area 107, a structure is obtained in which a body region is disposed onto the surface of the drift region 112.

The structure of the cell area 105 is now described. The main trenches 113 penetrate the body region 141 from a surface 101 of the semiconductor substrate 102 and reach the drift region 112. The intervals between the main trenches 113 are uniform. Sidewalls of the main trenches 113 are covered with a gate oxide film. Furthermore, an oxide film 171a is buried in a bottom surface of each main trench 113. A gate electrode 122 is buried in each main trench 113 in an insulated state from the semiconductor substrate 102 due to the presence of the gate oxide film and the oxide film 171a. The material of the gate electrode 122 is polysilicon. Each of the gate electrodes 122 penetrates the body region 141 from the surface of the body region 141 and reaches the drift region 112.

n+ source regions 131 are formed on the surface 101 of the semiconductor substrate 102, at positions adjacent to the main trenches 113. Furthermore, p+ body contact regions 132 are formed in the gaps between source regions 131. A source electrode 133 is formed on the surface of each source region 131 and body contact region 132. The source electrodes 133 are connected to a source wire S. A source electrode 133 is not formed on the outer side of the region which is surrounded by the termination trench 161.

The gate electrodes 122 are connected to a gate wire G. A gate voltage is applied to the gate electrodes 122. The gate electrodes 122 are insulated from the source electrodes 133 and the source wire S. The gate voltage is a voltage for controlling whether or not current flows in the cell area 105. The n+ drain region 111 is connected to a drain wire D. The drain wire D is connected to a positive potential and the source wire S is earthed. A vertical type power MOSFET transistor structure is formed inside the cell area 105 by the source regions 131, the body regions 141, the drift region 112, the drain region 111 and the gate electrode 122.

The structure of the termination area 107 is now described. Termination trenches 161 to 163 are formed in the termination area 107. The termination trench 161 is arranged at an innermost circumference of the three termination trenches. The termination trenches 162 and 163 surround the termination trench 161 and are arranged at an outer circumference of the termination trench 161. The termination trenches 161 to 163 all have identical depths. Furthermore, the depths of the trenches 161 to 163 are the same as a depth of the main trenches 113. The termination trenches 161 to 163 penetrate the body region 141 from the surface 101 of the semiconductor substrate 102 and reach the drift region 112.

A width of the termination trench 161 is a width W1. The value of the width W1 can be set to a value of 5 to 20 (micrometer). A width of the termination trenches 162 and 163 is a width W2. The width W2 of the termination trenches 162 and 163 is a narrower width than the width W1 of the termination trench 161.

The structure of the termination trench 161 will now be described. The sidewalls and bottom surface of the termination trench 161 are covered by an oxide film 171. Furthermore, a buried electrode 124 is formed on a surface of the oxide film 171 which covers the sidewalls and bottom surface of the termination trench 161. The material of the buried electrode 124 is polysilicon. Therefore, the buried electrode 124 is made from the same material as the gate electrode 122. Furthermore, the buried electrode 124 is connected to the gate wire G. Therefore, a gate voltage identical to that of the gate electrode 122 is applied to the buried electrode 124.

Looking in particular at the bottom surface portion of the termination trench 161, a structure is achieved in which the buried electrode 124 is formed on the surface of the drift region 112 via an oxide film 171. Consequently, a field plate structure is formed on the bottom surface portion of the termination trench 161. Furthermore, the termination trench 161 penetrates the body region 141 from the surface 101 of the semiconductor substrate 102 and reaches the drift region 112. Therefore, a field plate structure is formed in the vicinity of the drift region 112, rather than the surface 101 of the semiconductor substrate 102. In other words, a buried type field plate is formed.

Moreover, a thickness of the oxide film 171 on the bottom surface of the termination trench 161 is defined as a thickness T1. Similarly, a thickness of the oxide film 171a on the bottom surface of the main trenches 113 is defined as a thickness T2. The thickness T1 is thinner than the thickness T2. Accordingly, it is possible to form a field plate structure at a deeper position than the gate electrode 122.

Furthermore, the position of the buried electrode 124 will be described. An end portion 124a is formed towards the chip outer side (the direction of the termination area 107) on the surface of the semiconductor substrate 102 at a circumference edge of an opening portion of the termination trench 161, and an end portion 124b is formed towards the chip inner side (the direction of the cell area 105). Here, a thickness of the oxide film 171 which covers the sidewalls of the termination trench 161 is defined as a thickness T11. Here, a thickness of the oxide film 171 which covers a surface of the body region 141b is defined as a thickness T12. Furthermore, a position of a sidewall of the termination trench 161 towards the chip outer side is defined as a sidewall position P1. The position of the end portion 124a is desirably to the chip inward side of the sidewall position P1 (to the right side in FIG. 2). Moreover, more desirably, the position of the end portion 124a is in the range of the thickness T11.

An electric field is generated in the buried electrode 124. The generated electric field is a higher electric field on the side of the end portion 124a compared to the side of the end portion 124b. If the end portion 124a is positioned beyond the sidewall position P1 in the chip outward direction (to the left side in FIG. 2), then the electric field generated in the buried electrode 124 is applied to the oxide film 171 which covers the surface of the body region 141b. In this case, the thickness of the oxide film 171 in the region where the electric field is applied is the thickness T12, which is thin. On the other hand, if the end portion 124a is positioned further to the chip inner side than the sidewall position P1 (to the right side in FIG. 2), then the electric field generated in the buried electrode 124 is applied to the oxide film 171 which covers the sidewalls of the termination trench 161. In this case, the thickness of the oxide film 171 in the region where the electric field is applied is equal to the depth of the termination trench 161, and is a large thickness. From the foregoing, by setting the position of the end portion 124a to the chip inner side from the sidewall position P1, it is possible to achieve a large thickness of the oxide film 171 in the region where the electric field is applied, and therefore the concentration of the electric field in the oxide film 171 can be diminished. Consequently, it is possible to increase the withstand voltage of the termination area 107.

A Field Limiting Ring (FLR) structure which is formed by the termination trenches 162 and 163 is now described. In the semiconductor device 100 according to the present embodiment, a body region 141 is formed over the whole surface of the drift region 112, by an epitaxial growth method. Therefore, in the termination area 107 also, a body region 141 is disposed onto the surface of the drift region 112. Therefore, it is necessary to electrically separate the termination area 107.

The termination trenches 162 and 163 have a shape which surrounds the cell area 105 and are formed in the termination area 107. Moreover, the termination trenches 162 and 163 penetrate the body region 141 from the surface of the body region 141 and reach the drift region 112. Furthermore, the termination trenches 162 and 163 are filled with the oxide film 171. Therefore, the termination area 107 is electrically separated by the termination trenches 162 and 163.

Moreover, by forming the termination trenches 162 and 163, the p type body regions 141b, 141c, 141d (FIG. 2) are left surrounding the outer circumference of the termination trench 161 in a ring shape. In so doing, the body regions 141b, 141c, 141d left in a ring shape can be used as an FLR.

Furthermore, a source electrode 133 is not formed on the outer side of the region which is surrounded by the termination trench 161. Consequently, the body regions 141b, 141c, 141d which are positioned to the outer side of the termination trench 161 are not connected to any electrodes. In other words, the termination area 107 can be placed in a floating state which is insulated from the periphery.

The operation of the semiconductor device 100 is now described. The semiconductor device 100 is used with the source wire S earthed and maintained at GND potential, and a positive voltage applied to the drain wire D. When a positive voltage is applied to the gate electrodes 122, the body region 141a is inverted in the region opposing the gate electrode 122, thereby forming a channel, and the source region 131 and the drain region 111 are electrically connected. If a positive voltage is not applied to the gate electrodes 122, then current does not flow between the source region 131 and the drain region 111. Therefore, the semiconductor device 100 operates as a transistor.

Figure 9:
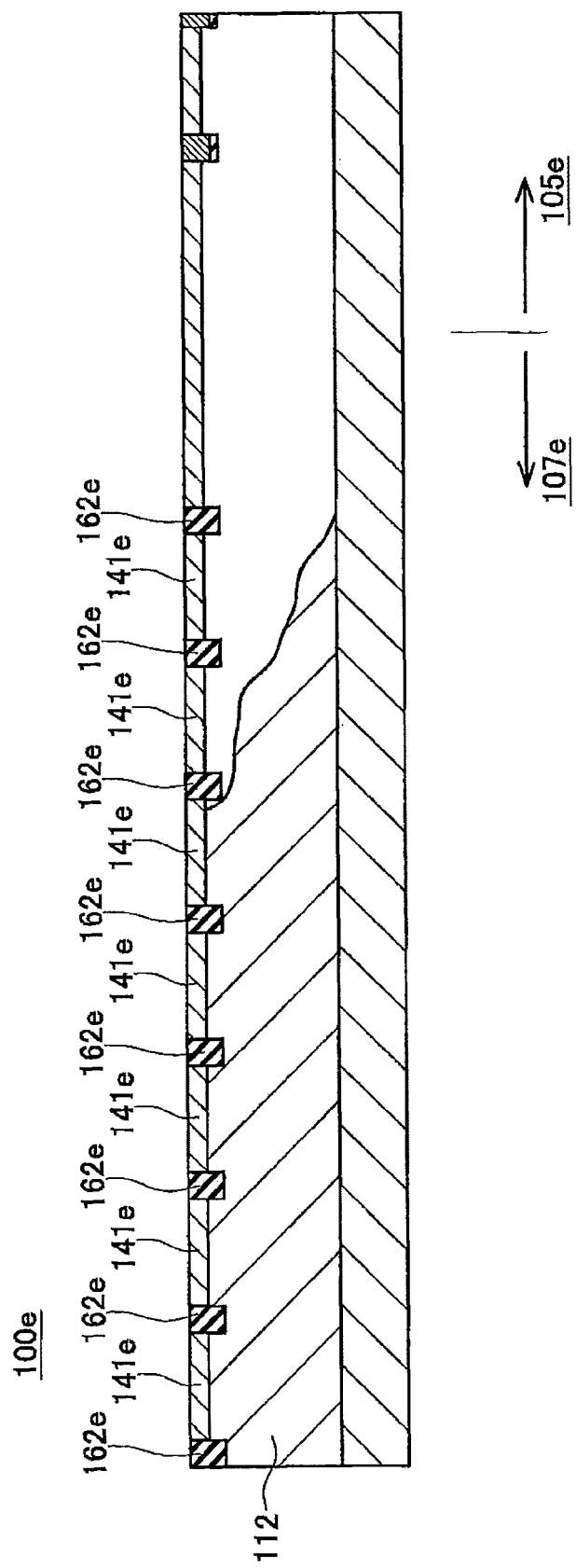
FIG. 9 is a first diagram of simulation results of the semiconductor device according to the embodiment of the present application.
Figure 10:
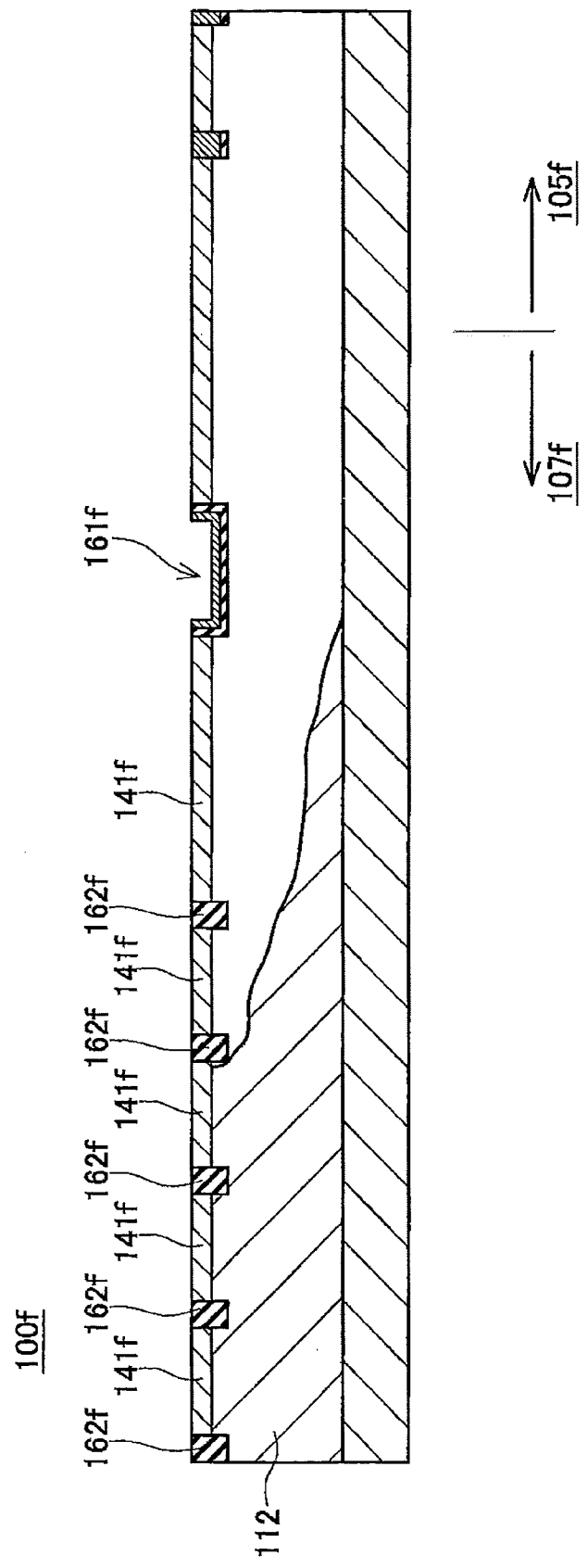
FIG. 10 is a second diagram of the simulation results of the semiconductor device according to an embodiment of the present application.

The beneficial effects in improving the withstand voltage by a buried type field plate structure are now described with reference to FIG. 9 and FIG. 10. FIG. 9 and FIG. 10 show simulation results relating to broadening of the depletion layer in a cross-section in the vicinity of the boundary between the cell area and the termination area.

The semiconductor device 100e shown in FIG. 9 has a composition in which eight termination trenches 162e are formed in the termination area 107e (the left side in FIG. 9). The termination trenches 162e are trenches which are filled with an oxide film. Furthermore, seven body regions 141e which function as an FLR are formed between the termination trenches 162e.

On the other hand, the semiconductor device 100f in FIG. 10 has a composition in which a termination trench 161f is formed at an innermost circumference of the termination area 107f (the left side in FIG. 10). The termination trench 161f is a trench having a buried field plate structure. Furthermore, five termination trenches 162f are formed at the outer circumference of the termination trench 161f. The termination trenches 162f are trenches into which an oxide film is filled. Furthermore, five body regions 141f which function as an FLR are formed at the outer circumference of the termination trench 161f.

Moreover, in the present application, a simulation is carried out in a state where the depletion layer has extended after switching off the gate voltage. Furthermore, a simulation is carried out in a case where a reverse bias voltage is applied to the semiconductor device 100. In the semiconductor devices 100e and 100f, the drift layer density, the drift layer thickness, the trench depth, the applied voltage, and other simulation conditions, are set to identical conditions. Therefore, the difference between the semiconductor device 100e and the semiconductor device 100f is the presence or absence of the termination trench 161f.

In FIG. 9 and FIG. 10, the white region represents the depletion layer. In the semiconductor device 100f (FIG. 10), the depletion layer broadens further towards the termination area 107f, compared to the semiconductor device 100e (FIG. 9). This is because the buried field plate structure of the termination trench 161f in the semiconductor device 100f shown in FIG. 10 promotes depletion in the drift region 112. The broader the depleted surface area, the higher the drain-source withstand voltage. From the above, it can be seen that beneficial effects in extending a depletion layer formed in a drift region 112 and preventing concentration of electric field can be obtained by a buried type field plate. It can also be seen that the withstand voltage in the vicinity of the termination portion of the cell area is increased.

The beneficial effects of the semiconductor device 100 relating to the first embodiment of the present application are now described. For example, if SiC is used as the semiconductor substrate, then the band gap is larger than with Si, and therefore the relative permittivity is low and the depletion layer is not liable to broaden. Therefore, even if a field plate structure is provided on the surface of a semiconductor device based on SiC, it is difficult to obtain beneficial effects in improving the withstand voltage as obtained with a semiconductor device based on Si. However, in the semiconductor device 100 according to the present application, a buried type field plate is formed. Therefore, it is possible to form a field plate in the vicinity of the region where it is desired to broaden the depletion layer. Consequently, even if using SiC in which the depletion layer is not liable to broaden, beneficial effects in preventing concentration of electric field by extending the depletion layer formed in the semiconductor by a field plate can be obtained. Accordingly, it is possible to more reliably ensure the withstand voltage of the termination portion of the cell area 105.

Moreover, by forming the termination trenches 162 and 163, the p type body regions 141b, 141c, 141d are left surrounding the outer circumference of the termination trench 161 in a ring shape. In this case, it is possible to use the body region left in a ring shape as an FLR. Consequently, it is still possible to form an FLR even with a structure in which a body region 141 is disposed on the surface of the drift region 112 of the termination area 107. Therefore, it is possible to diminish the electric field in the termination portion of the cell area, by the FLR.

Figure 3:
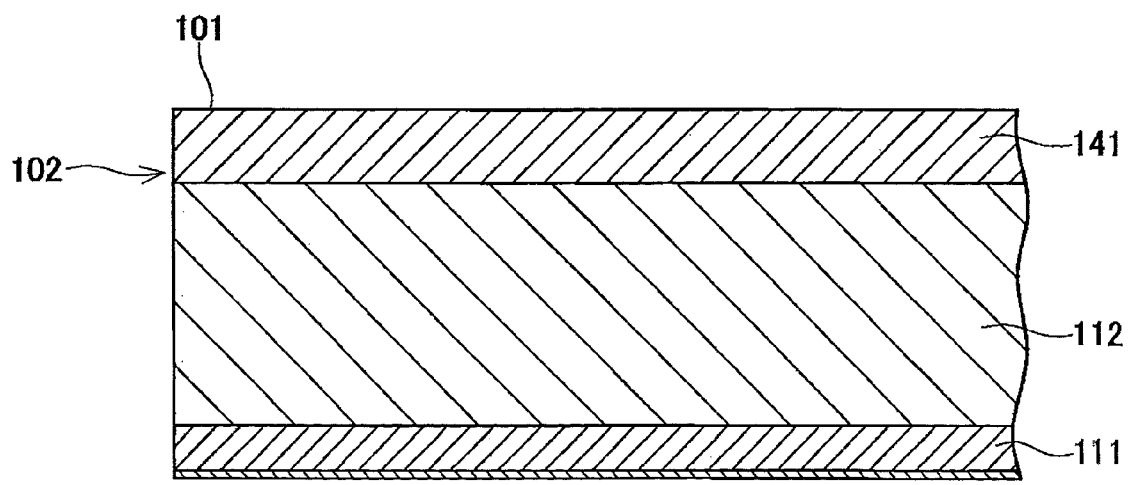
FIG. 3 is a first diagram of a manufacturing process for a semiconductor device according to an embodiment of the present application.

Next, a process for manufacturing a semiconductor device 100 will be described with reference to FIG. 3 to FIG. 8. FIG. 3 to FIG. 8 are cross-sectional diagrams along line II-II in FIG. 1. Firstly, a body region 141 is formed by epitaxial growth on a drift region 112. Consequently, a semiconductor substrate 102 having a body region 141 which is an epitaxial layer on the drift region 112 such as that shown in FIG. 3 is manufactured. Furthermore, source regions 131 and body contact regions 132 are formed.

Figure 4:
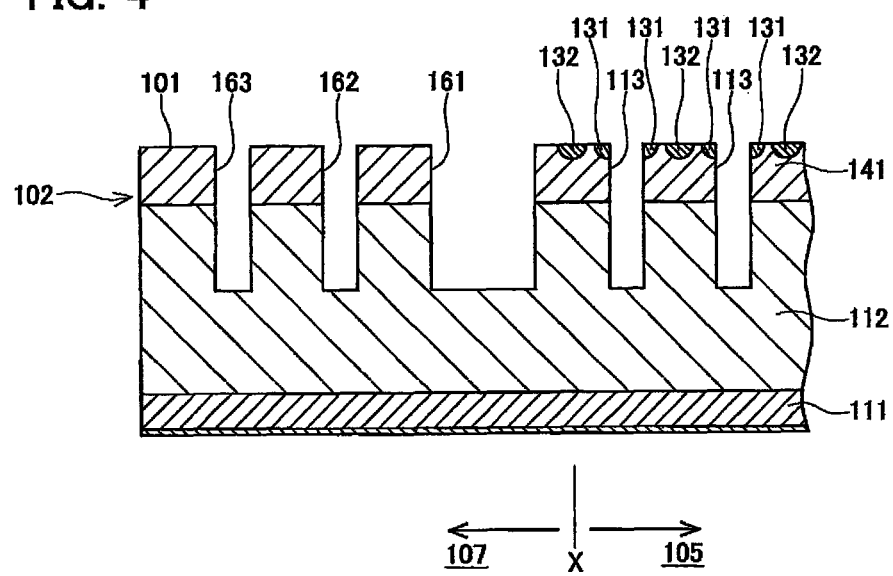
FIG. 4 is a second diagram of the manufacturing process for the semiconductor device according to the embodiment of the present application.

Thereupon, an oxide film layer is formed by CVD (Chemical Vapor Deposition) on the surface 101 of the semiconductor substrate 102, and a resist layer is formed on the upper surface of this oxide film layer. Opening portions corresponding to main trenches 113 and termination trenches 161 to 163 are formed in the oxide film layer by a photo-etching technique. A photo-etching technique means a series of processes from photolithography to etching by RIE, or the like. A conventionally known method can be used as the photo-etching technique, and detailed description thereof is omitted here. Next, dry etching of the body region 141 and the drift region 112 is carried out using the oxide film layer as a mask. Consequently, as shown in FIG. 4, a plurality of main trenches 113 are formed in the cell area 105 and termination trenches 161 to 163 are formed in the termination area 107. Furthermore, the main trenches 113 and termination trenches 161 to 163 all have identical depths, and hence these trenches can be formed simultaneously. Consequently, additional processes for forming the termination trenches 161 to 163 are not required, and the manufacturing process for a semiconductor device 100 can be simplified.

Figure 5:
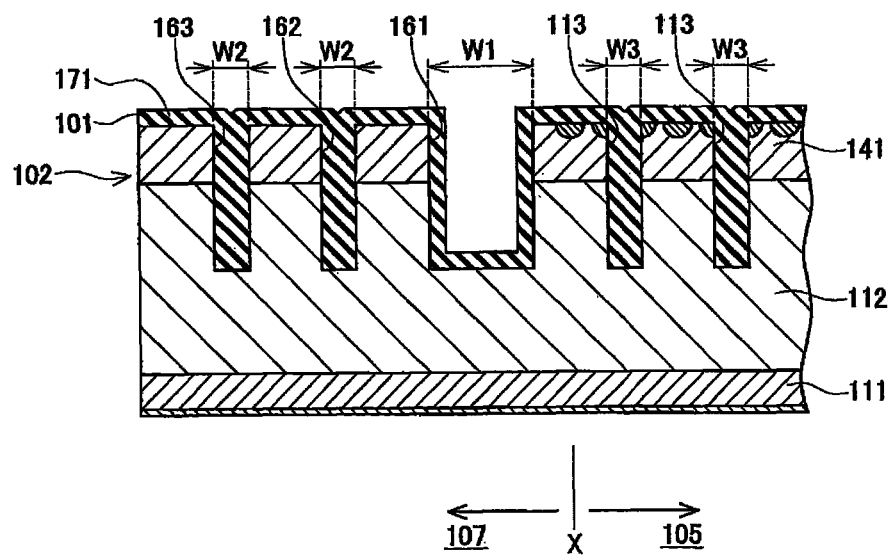
FIG. 5 is a third diagram of the manufacturing process for the semiconductor device according to the embodiment of the present application.

Next, as shown in FIG. 5, an oxide film 171 of a prescribed thickness is deposited over the whole of the surface 101 of the semiconductor substrate 102 by CVD. Consequently, the oxide film 171 is buried inside the main trenches 113 and the termination trenches 161 to 163. The oxide film 171 may use TEOS (Tetra Ethyl Ortho Silicate), BPSG (Boron Phosphor Silicate Glass), or SOG (Spin on Glass) as a starting material.

A method for determining a film thickness of the oxide film 171 is now described. The width W2 of the termination trenches 162 and 163 is a narrower width than the width W1 of the termination trench 161. Moreover, the width W3 of the termination trenches 113 is narrower than the width W1 of the termination trench 161. Therefore, the film thickness of the oxide film 171 should be a thickness by which the main trenches 113 and the termination trenches 162 and 163 are fully filled, but the termination trench 161 is not fully filled.

Accordingly, the main trenches 113 and the termination trenches 162 and 163 which are filled with oxide film 171, and the termination trench 161 which has an oxide film 171 formed on sidewalls and the bottom surface, can be formed simultaneously in one oxide film forming process.

Figure 6:
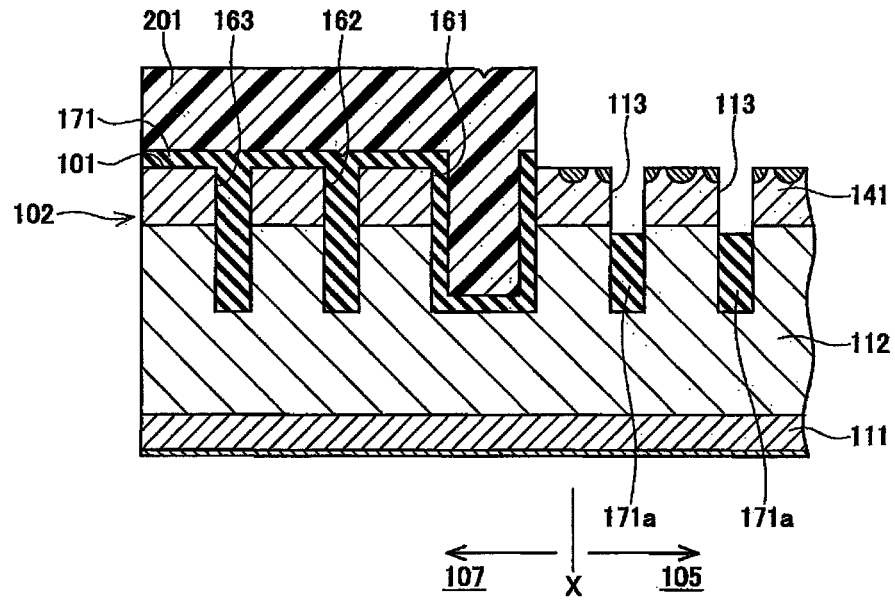
FIG. 6 is a fourth diagram of the manufacturing process for the semiconductor device according to the embodiment of the present application.

Moreover, there is a source electrode 133 on the cell area 105 side of the termination trench 161 (the right side in FIG. 2), which therefore assumes a source potential. On the other hand, there is no source electrode 133 on the termination area 107 side of the termination trench 161 (the left side in FIG. 2), which therefore assumes a high potential. As a result of this, the thickness of the oxide film 171 is desirably a thickness which can withstand the electric field generated in the termination trench 161. The thickness of the oxide film 171 may be a value of 1 (micrometer), for example. Next, as shown in FIG. 6, resist 201 is formed on the termination area 107 of the surface of the semiconductor substrate 102. Etching of the oxide film 171 is then carried out using the resist 201 as a mask. Therefore, the surface of the body region 141 in the cell area 105 is exposed. Furthermore, the height of the oxide film 171a filled into the main trench 113 is adjusted. Here, desirably, the height of the oxide film 171a is adjusted to a height whereby, in a polysilicon deposition process which is described hereinafter, a lower end surface of a gate electrode 122 which is buried in each of the main trenches 113 is positioned in the vicinity of the interface between the drift region 112 and the body region 141. Moreover, the oxide film 171 in the termination area 107 is protected by the resist 201 and therefore is not etched. When the height adjustment of the oxide film 171a has been completed, the resist 201 is removed.

Figure 7:
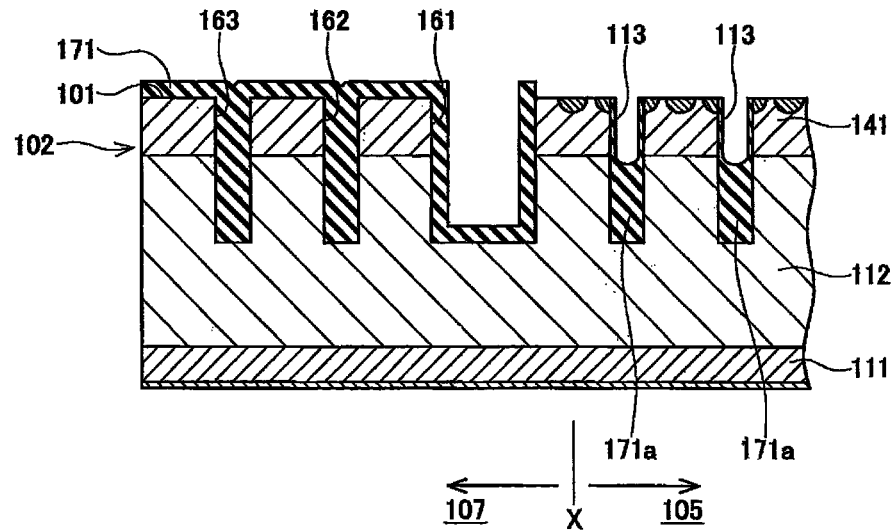
FIG. 7 is a fifth diagram of the manufacturing process for the semiconductor device according to the embodiment of the present application.

As shown in FIG. 7, a thermal oxide film is formed by a thermal oxidation process on the sidewalls of the main trenches 113. Accordingly, a gate oxide film is formed.

Figure 8:
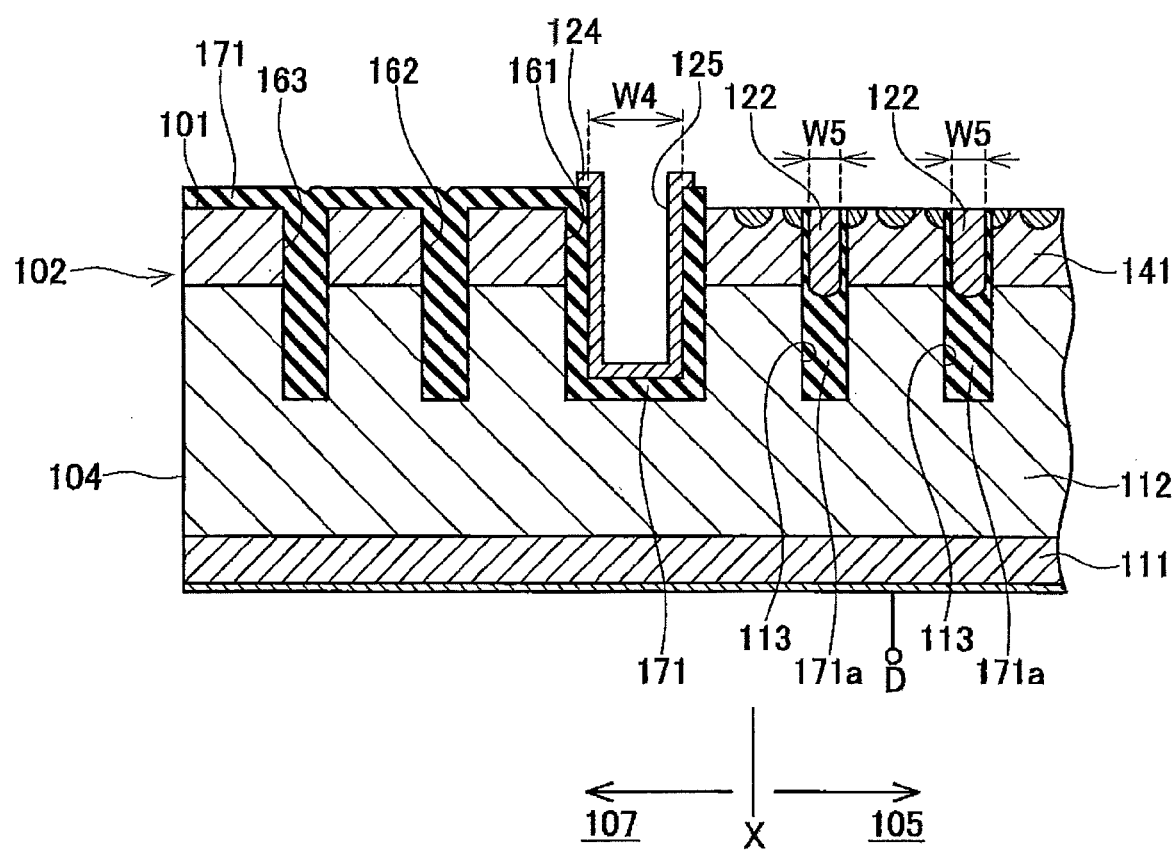
FIG. 8 is a sixth diagram of the manufacturing process for the semiconductor device according to the embodiment of the present application.

Next, polysilicon is deposited on the surface of the semiconductor substrate 102. The polysilicon in the portions other than the main trenches 113 and the termination trench 161 is removed by a photo-etching technique. Therefore, as shown in FIG. 8, the main trenches 113 are filled with polysilicon, thereby forming gate electrodes 122. Furthermore, polysilicon also deposited on the sidewalls and bottom surface of the termination trench 161, thereby forming a buried electrode 124. Consequently, it is possible to form the gate electrodes 122 and the buried electrode 124 simultaneously in one electrode forming process.

A method for determining a film thickness of the polysilicon is now described. An opening width W4 of the termination trench 161 is broader than an opening width W5 of the main trenches 113. Therefore, the film thickness of the polysilicon should be a thickness by which the main trenches 113 are fully filled, but the termination trench 161 is not fully filled.

In forming the buried electrode 124, since the inside of the termination trench 161 is not fully filled with polysilicon, then a groove portion 125 is formed. The groove portion 125 may be filled with a BPSG film or an SOG film. Finally, by forming a source electrode and a drain electrode, the semiconductor device 100 shown in FIG. 2 is completed.

The beneficial effects obtained by the manufacturing process for a semiconductor device 100 according to the present application will now be described. In the manufacturing process according to the present application, a plurality of main trenches 113 and termination trenches 161 to 163 can be formed simultaneously in one etching process. Furthermore, it is also possible to carry out a process for completely burying the termination trenches 162 and 163 with an oxide film and a process for depositing an oxide film on the sidewalls and bottom surface of the termination trench 161, simultaneously in one oxide film forming process. Moreover, it is also possible to form the gate electrodes 122 and the buried electrode 124 simultaneously in one electrode forming process. Consequently, additional processes for forming the termination trenches 161 to 163 are not required, and the manufacturing process for a semiconductor device 100 can be simplified.

(Second Embodiment)

Figure 17:
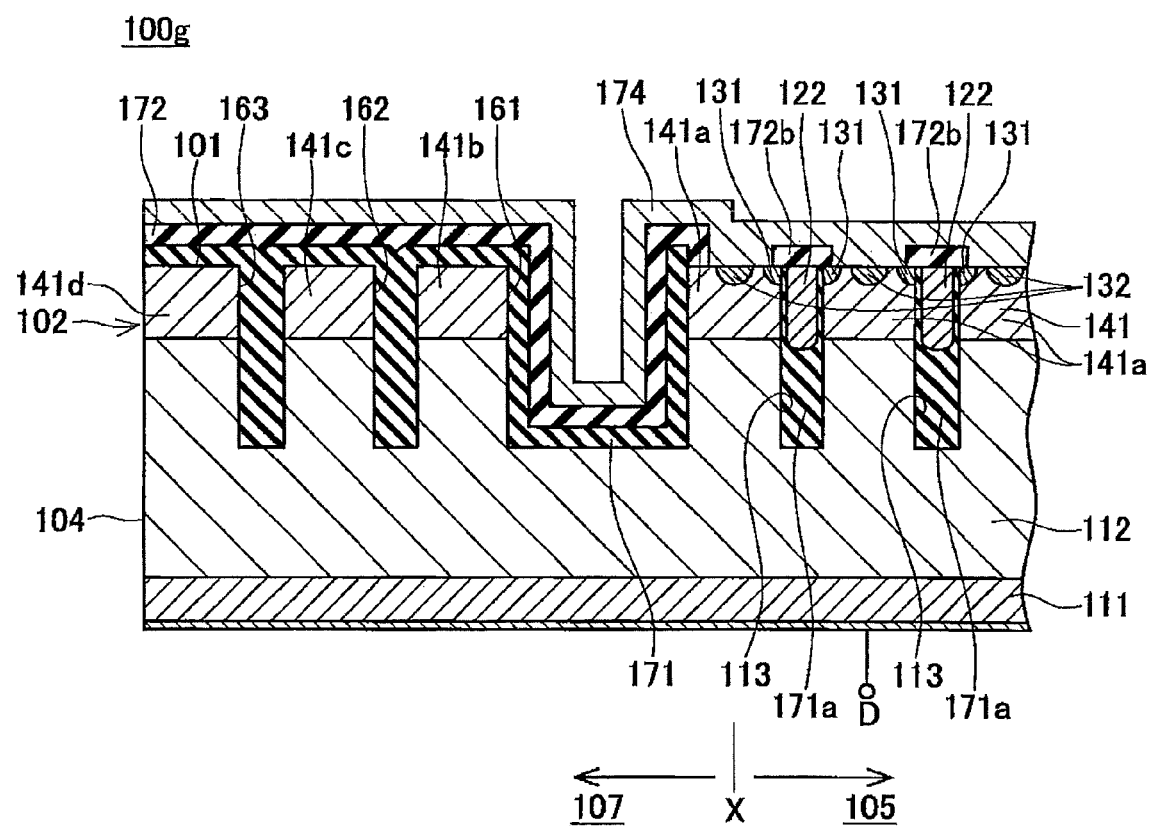
FIG. 17 is a cross-sectional diagram of a semiconductor device according to a second embodiment of the present application.

A semiconductor device 100g relating to a second embodiment is now described in detail. As shown in FIG. 17, in the semiconductor device 100g, sidewalls and a bottom surface of a termination trench 161 are covered with an oxide film 171 and an interlayer insulating layer 172. Furthermore, upper portions of main trenches 113 are respectively covered with interlayer insulating layers 172b. A metal film 174 is formed so as to cover, in continuous fashion, a surface of the interlayer insulating layer 172 which covers the bottom surface and sidewalls of the termination trench 161, a surface of a body region 141a in a region to the inner circumference side of the termination trench 161, and surfaces of the interlayer insulating layers 172b which cover the main trenches 113. Furthermore, the metal film 174 is connected to a source electrode (not illustrated) and a source voltage is applied thereto. One example of the metal film 174 is aluminum. It is also possible to use various other metals, such as copper or an aluminum alloy, for the metal film 174.

Gate electrodes 122 to which a gate voltage is applied and the metal film 174 to which a source voltage is applied are electrically insulated by the interlayer insulating layer 172b. Contact holes which expose the surface of the gate electrodes 122 are formed in the interlayer insulating layers 172b in any cross-section in the depth direction of FIG. 17. Moreover, gate electrodes (not illustrated) which are connected to the gate electrodes 122 are formed via these contact holes.

The structure of the termination trench 161 will now be described. The sidewalls and bottom surface of the termination trench 161 are covered by the oxide film 171 and the interlayer insulating layer 172. Furthermore, a metal film 174 is formed on a surface of the interlayer insulating layer 172 which covers the sidewalls and bottom surface of the termination trench 161. The internal structure and other structure shown in FIG. 17 are similar to the internal structure in FIG. 2 and therefore description thereof is omitted here.

The beneficial effects of the semiconductor device 100g relating to the second embodiment of the present application are now described. Looking in particular at the bottom surface portion of the termination trench 161, a structure is achieved in which the metal film 174 which functions as a buried electrode is formed on the surface of the drift region 112 via an oxide film 171 and an interlayer insulating layer 172. Consequently, a field plate structure can be formed on the bottom surface portion of the termination trench 161. Therefore, similarly to the semiconductor device 100 relating to the first embodiment (FIG. 2), it is possible to form a field plate in the vicinity of the region where it is desired to broaden the depletion layer. Consequently, even if using SiC in which the depletion layer is not liable to broaden, beneficial effects in preventing concentration of electric field by extending the depletion layer formed in the semiconductor by a field plate can be obtained.

Furthermore, in the semiconductor device 100g relating to the second embodiment (FIG. 17), a source electrode is applied, to the metal film 174 which functions as a buried electrode. The source voltage is generally a stable potential (ground potential, etc.). On the other hand, the gate voltage is a potential which varies between an on potential and an off potential. Therefore, the beneficial effects of the field plate can be further stabilized compared to a case where a gate voltage is applied to the metal film 174.

(Third Embodiment)

Figure 12:
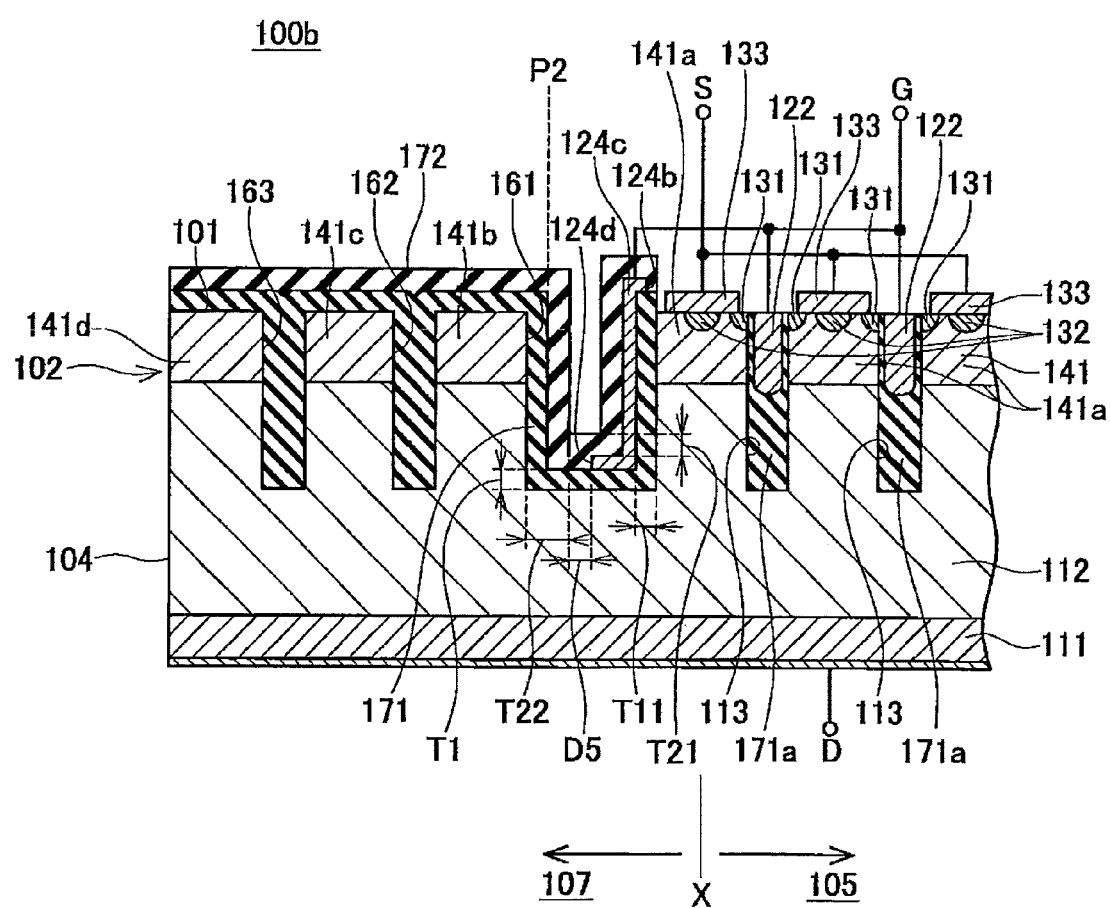
FIG. 12 is a cross-sectional diagram of a semiconductor device according to a third embodiment of the present application.

A semiconductor device 100b relating to a third embodiment is now described in detail. As shown in FIG. 12, in the semiconductor device 100b, sidewalls and a bottom surface of a termination trench 161 are covered with an oxide film 171. Furthermore, a buried electrode 124c is formed on a surface of the oxide film 171 which covers the sidewalls and bottom surface of the termination trench 161. The material of the buried electrode 124c is polysilicon. Furthermore, the buried electrode 124c is connected to a gate wire G.

The formation position of the buried electrode 124c is now described. An end portion 124d is formed in the buried electrode 124c. Here, when the semiconductor device 100b is observed from vertically above, the position of the surface of the oxide film 171 which covers the sidewall on the chip outer side (termination area 107 side) of the termination trench 161 is defined as position P2. The position of the end portion 124d is to the chip inner side of the position P2. The buried electrode 124c is formed in a region to the chip inner side (to the side of the cell area 105) from the end portion 124d.

Furthermore, the surface of the buried electrode 124c which is formed on the sidewalls of the termination trench 161, the surface of the buried electrode 124c which is formed on the bottom surface of the termination trench 161, the end portion 124d, the surface of the oxide film 171 which covers the bottom surface of the termination trench 161 in the region to the chip outer side from the end portion 124d, and the surface 101 of the semiconductor substrate 102 in the region to the chip outer side from the termination trench 161, are all covered by the interlayer insulating layer 172. The interlayer insulating layer 172 is an insulating layer which is formed between the substrate and the wiring. One example of the metal film 172 is a BPSG film.

Since the buried electrode 124c is not covered between the position P2 and the end portion 124d of the buried electrode 124c, then a trench-shaped region is formed. The distance D5 from the position P2 to the end portion 124d of the buried electrode 124c should be decided in such a manner that this trench-shaped region is covered by the interlayer insulating layer 172 in a state without any voids. More specifically, the distance D5 is decided by the step coverage of the interlayer insulating layer 172. The step coverage is the ratio of the thickness of the interlayer insulating layer 172 which covers the sidewalls of the trench, to the thickness of the interlayer insulating layer 172 which covers the bottom surface of the trench. In a typical interlayer insulating layer 172, the step coverage is 100% and the film thicknesses covering the bottom surface and the sidewalls of the trench can be regarded as being equal. In this case, if the thickness of the interlayer insulating layer 172 which covers the buried electrode 124c positioned on the bottom surface of the termination trench 161 is defined as the thickness T21, then the distance D5 is desirably two times the thickness T21. If the step coverage is low (if the covering thickness on the trench sidewalls is thinner than the covering thickness on the trench bottom surface), then the distance D5 is specified in accordance with the step coverage. For example, if the step coverage is 80(%), then the distance D5 should be 1.6 times the thickness T21. Therefore, it is possible to further increase the beneficial effects of diminishing the electric field intensity.

Furthermore, the combined thickness of the oxide film 171 which covers the sidewall on the chip outer side of the termination trench 161 and the interlayer insulating layer 172 is defined as the thickness T22. The thickness T22 is greater than the thickness T1 (the thickness of the oxide film 171 on the bottom surface of the termination trench 161) and the thickness T11 (the thickness of the oxide film 171 which covers the sidewall of the termination trench 161). The internal structure and other structure shown in FIG. 12 are similar to the internal structure in FIG. 2 and therefore description thereof is omitted here.

The beneficial effects of the semiconductor device 100b relating to the third embodiment of the present application are now described. When the semiconductor device 100b is off, if a potential equal to the potential applied to the gate electrodes 122 is applied to the buried electrode 124c, then an electric field is concentrated in the insulating layer which covers the sidewall on the chip outer side of the termination trench 161. However, in the semiconductor device 100b according to the present embodiment, the thickness of the insulating layer in the sidewall portion on the chip outer side of the termination trench 161 is thickened by the covering provided by the interlayer insulating layer 172. More specifically, the thickness T22 of the insulating layer (the oxide film 171 and the interlayer insulating layer 172) in the sidewall portion on the chip outer side of the termination trench 161 is greater than the thickness T1 and the thickness T11. Therefore, it is possible to diminish the electric field intensity in the insulating layer which covers the sidewall on the chip outer side of the termination trench 161. Consequently, it is possible to increase the withstand voltage of the termination area 107.

Furthermore, the interlayer insulating layer 172 is an essential film for creating wiring, and the like, in the semiconductor device 100b. In the semiconductor device 100b according to the present embodiment, the interlayer insulating layer 172 may also be used as an insulating layer in the sidewall portion on the chip outer side of the termination trench 161. Therefore, it is not necessary to add a special process for making the insulating layer thicker on the sidewall on the chip outer side of the termination trench 161, and therefore the manufacturing process for the semiconductor device 100b can be simplified.

Moreover, a region where the buried electrode 124c is not covered is formed from the position P2 to the end portion 124d of the buried electrode 124c. In the semiconductor device 100b disclosed in the present application, the distance D5 between the position P2 and the end portion 124d is two times the thickness T21. Consequently, when the interlayer insulating layer 172 is buried in the region between the position P2 and the end portion 124d, voids are not liable to form. Therefore, it is possible to further increase the beneficial effects of diminishing the electric field intensity in the insulating layer.

Furthermore, the greater the thickness of the insulating layer, the greater the capacity of diminishing the electric field. However, the thicker the insulating layer which directly covers the termination trench 161, the greater the stress applied to the termination trench 161. In the semiconductor device 100b disclosed in the present application, only the thickness T22 of the insulating layer which directly covers the sidewall on the chip outer side of the termination trench 161 is greater than the thickness T1 of the oxide film 171 which directly covers the bottom surface portion and the thickness T11 of the oxide film 171 which directly covers the sidewall on the chip inner side. Therefore, as well as diminishing the electric field by making the thickness of the insulating layer thick only in the portion where the electric field concentrates, the stress can also be reduced by making the insulating layer thin in the portion where the electric field does not concentrate. Therefore, it is possible to diminish the electric field, and to reduce the stress, simultaneously.

(Fourth Embodiment)

Figure 14:
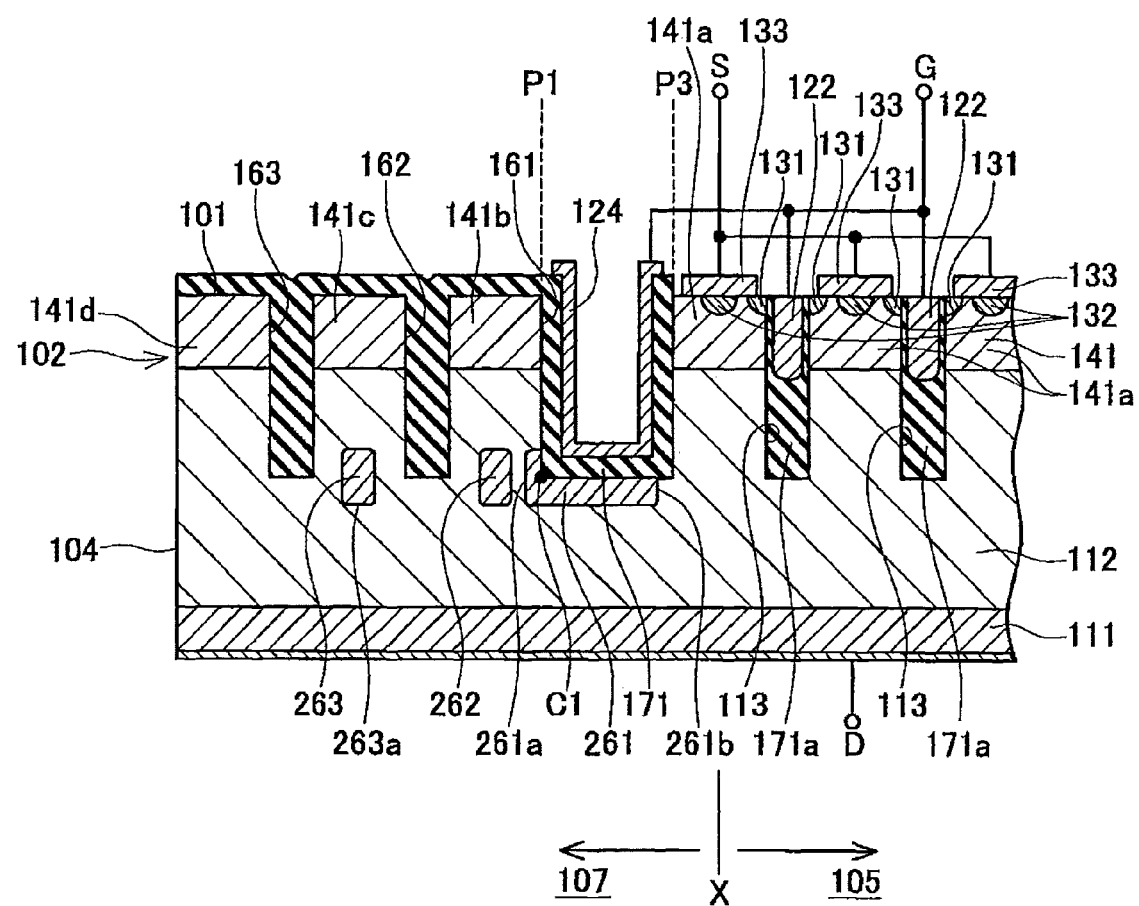
FIG. 14 is a cross-sectional diagram along line XIV-XIV in FIG. 13.

A semiconductor device 100c relating to a fourth embodiment is now described in detail. As shown in FIG. 14, a diffusion layer 261 is formed in a drift region 112 which is positioned on a bottom surface of a termination trench 161. As described below, the diffusion layer 261 is a diffusion layer for diminishing the electric field. An end portion 261a and an end portion 261b are formed in the diffusion layer 261. The end portion 261a is positioned to the chip outer side of a sidewall position P1 (the position of the side on the chip outer side of the termination trench 161). Furthermore, a position of a sidewall on the chip inner side of the termination trench 161 is defined as a sidewall position P3. The end portion 261b is positioned to the chip outer side of the sidewall position P3. Consequently, when the semiconductor device 100c is observed from vertically above, a diffusion layer 261 is formed in such a manner that a corner portion C1 (the junction portion between the bottom surface of the termination trench 161 and the sidewall on the chip outer side of the termination trench 161) is covered.

Furthermore, a p type diffusion layer 263 is formed in a drift region 112 which is present between the mutually adjacent termination trenches 162 and 163. The diffusion layer 263 is separated from the body region 141c. Moreover, the end portion 263a of the diffusion layer 263 is positioned deeper than the bottom surfaces of the termination trenches 162 and 163. Moreover, a p type diffusion layer 262 is formed in a drift region 112 which is present between the termination trench 161 and the termination trench 162 which is adjacent to the termination trench 161. The diffusion layer 262 is separated from the body region 141b. Moreover, the diffusion layer 262 is also separated from the diffusion layer 261. As described hereinafter, the diffusion layers 262 and 263 are diffusion layers for improving the withstand voltage of the termination area 107. The internal structure and other structure shown in FIG. 14 are similar to the internal structure in FIG. 2 and therefore description thereof is omitted here.

Figure 13:
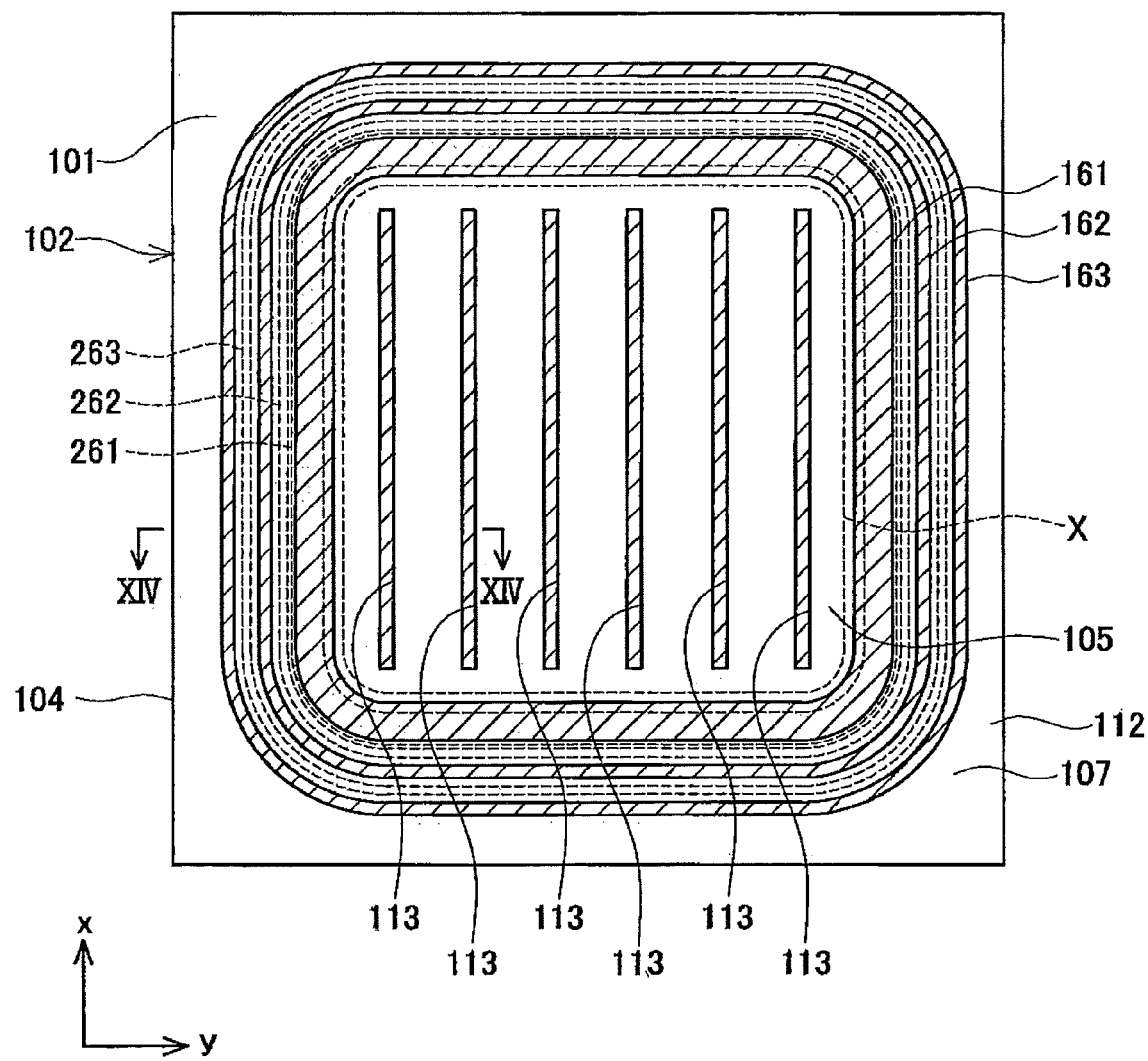
FIG. 13 is a cross-sectional diagram of a semiconductor device according to a fourth embodiment of the present application.

A layout of the diffusion layers 261 to 263 is described now with reference to the plan diagram of the semiconductor device 100c in FIG. 13. The diffusion layer 261 is formed so as to extend along a sidewall on the chip outer side of the termination trench 161. Moreover, the diffusion layer 262 is formed so as to extend along the termination trench 161 between the termination trenches 161 and 162. Furthermore, the diffusion layer 263 is formed so as to extend along the termination trench 162 between the termination trenches 162 and 163. The diffusion layers 261 to 263 are formed as closed loops which encircle the whole of the cell area 105 along an outer circumference 104.

The beneficial effects obtained by forming the diffusion layer 261 will now be described. When the semiconductor device 100b is off, electric field is concentrated in the oxide film 171 which covers the sidewall on the chip outer side of the termination trench 161. In the semiconductor device 100c disclosed in the present application, a depletion layer at a PN junction between the diffusion layer 261 and the drift region 112 extends greatly to the side of the drift region 112. Therefore, the high voltage caused by the effects of the drain voltage is not liable to enter into the oxide film 171 which covers the sidewall on the chip outer side of the termination trench 161. Consequently, it is possible to diminish the electric field in the oxide film 171 which covers the sidewall of the termination trench 161.

Furthermore, the electric field concentrates in particular in the corner portion C1 which is the junction between the bottom surface of the termination trench 161 and the sidewall on the chip outer side of the termination trench 161. In the semiconductor device 100c disclosed in the present application, a diffusion layer 261 is formed so as to cover the corner portion C1. Therefore, it is possible effectively to diminish the concentration of the electric field in the corner portion C1 of the termination trench 161.

Furthermore, the beneficial effects obtained by forming the diffusion layers 262 and 263 will now be described. In the semiconductor device 100c, since the termination trenches 162 and 163 are formed, then body regions 141b, 141; 141d remaining in a ring shape are used as an FLR. Furthermore, since the diffusion layers 262 and 263 are formed, then the depletion layer in the PN junction portion between the diffusion layers 262 and 263 and the drift region 112 extends to the side of the drift region 112. Consequently, it is possible to further enhance the beneficial effects of broadening the depletion layer which extends from the circumference edge portion of the cell area 105, to the outer side of the FLR. Consequently, it is possible to more reliably ensure the withstand voltage of the termination area 107.

Furthermore, if the diffusion layer 261 is formed so as to make contact with the body region 141a which is present in the region to the chip inner side of the termination trench 161, then the depletion layer extends starting from the diffusion layer 261. In this case, the depletion layer extends starting from the vicinity of an end portion 261a of the diffusion layer 261 which is positioned to the chip outer side of the buried electrode 124 of the termination trench 161. In so doing, the beneficial effects of the field plate structure of the termination trench 161, such as broadening the depletion layer which extends from the circumference edge portion of the cell area 105, to the outer side of the FLR, become less readily obtainable. However, in the semiconductor device 100c disclosed in the present application, the end portion 261b of the diffusion layer 261 is positioned to the chip outer side of the sidewall position P3. Consequently, it is possible reliably to prevent situations where a diffusion layer 261 is formed in contact with the body region 141a. Therefore, it is possible sufficiently to obtain the beneficial effects of the field plate in the termination trench 161.

Furthermore, in the semiconductor device disclosed in the present application, by separating the diffusion layers 262, 263 from the body regions 141b, 141c, it is possible to form diffusion layers 262 and 263 at a deeper position inside the drift region 112, compared to a case where the diffusion layers 262, 263 and the body regions 141h, 141c lie in contact. In this case, it is possible to cause the depletion layer at the PN junction between the diffusion layers 262 and 263 and the drift region 112 to extend more deeply into the drift region 112. Therefore, it is possible to further enhance the beneficial effects of broadening toward the outer side of the FLR the depletion layer which extends from the circumference edge portion of the cell area 105. Moreover, if the end portion 263a is situated at a deeper position than the bottom surface of the termination trenches 162 and 163, as in the end portion 263a of the diffusion layer 263, then as well as being able to further raise the beneficial effects of broadening the depletion layer to the outer side of the FLR, it is also possible to further diminish concentration of electric field in the bottom portions of the termination trenches 162 and 163.

Figure 15:
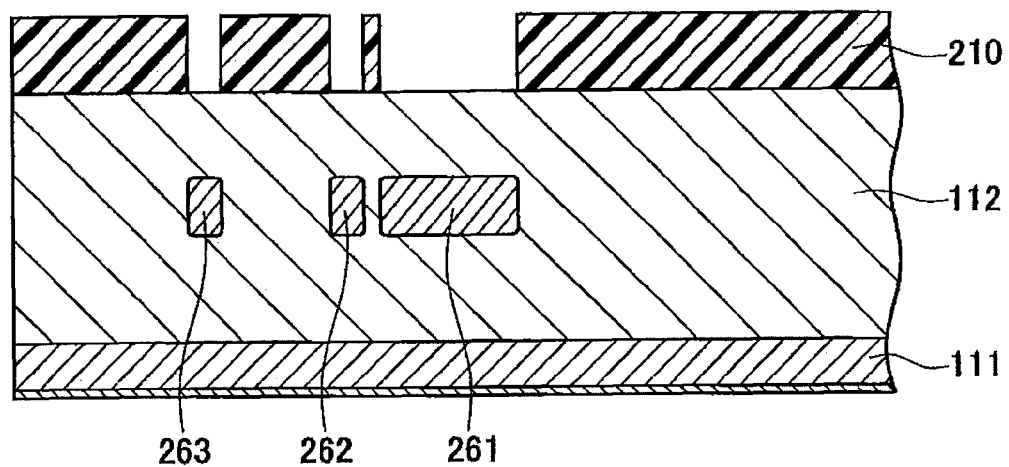
FIG. 15 is a first diagram of a manufacturing process for a semiconductor device according to an embodiment of the present application.
Figure 16:
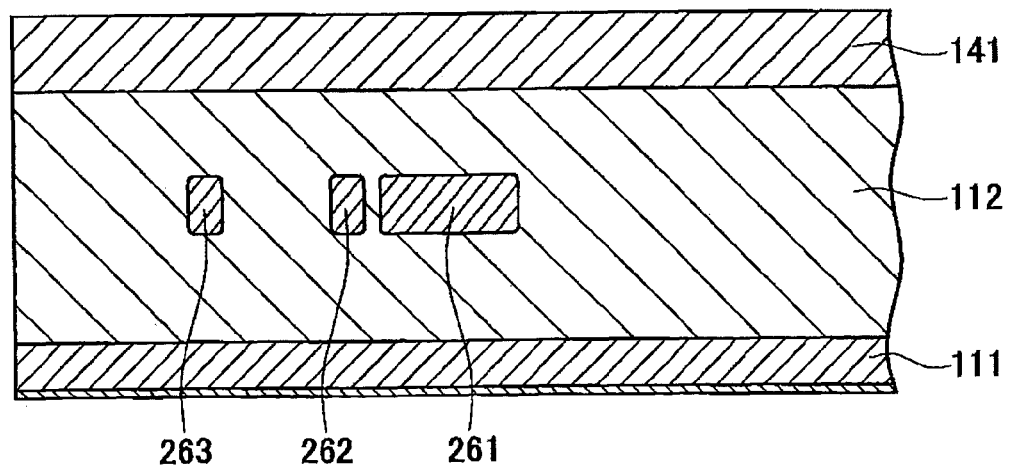
FIG. 16 is a second diagram of the manufacturing process for the semiconductor device according to the embodiment of the present application.

Next, a process for manufacturing the diffusion layers 261 to 263 in the semiconductor device 100b will be described with reference to FIG. 15 and FIG. 16. Firstly, a drift region 112 is formed by epitaxial growth on a surface of a drain region 111. A mask layer 210 is also formed on the surface of the drift region 112. Opening portions corresponding to the diffusion layers 261 to 263 are formed at the mask layer 210, by a photo-etching technique. Moreover, ion injection is carried out using the mask layer 210 as a mask. Consequently, as shown in FIG. 15, a semiconductor substrate 102 in which diffusion layers 261 to 263 are formed in the drift region 112 is manufactured.

Thereupon, the mask layer 210 is detached. A body region 141 is then formed by epitaxial growth on a drift region 112. Thereby, the semiconductor substrate 102 shown in FIG. 16 is manufactured. The manufacturing process from FIG. 16 onwards is the same as the manufacturing process from FIG. 4 to FIG. 8, and therefore detailed description thereof is omitted here.

SiC has a low impurity diffusion coefficient compared to Si. Therefore, with SiC, it is difficult to form a diffusion layer at a deep position from the substrate surface, by ion injection. In the manufacturing process according to the present application, after the diffusion layers 261 to 263 have been formed by carrying out ion injection from the surface of the drift region 112, a body region 141 is formed by epitaxial growth on the surface of the drift region 112. Consequently, it is possible to form a diffusion layer at a deeper position from the substrate surface, compared to a case where ion injection is carried out from the surface of the body region 141.

Furthermore, there are also cases where a diffusion layer is created in a drift region 112 which is positioned at a bottom surface of a main trench 113. In this case, it is possible to form the diffusion layers 261 to 263 simultaneously, in a process for creating diffusion layers in the bottom portions of the plurality of main trenches 113. Accordingly, additional processes for forming the diffusion layers 261 to 263 are not required, and the manufacturing process for a semiconductor device 100b can be simplified.

(Fifth Embodiment)

Figure 18:
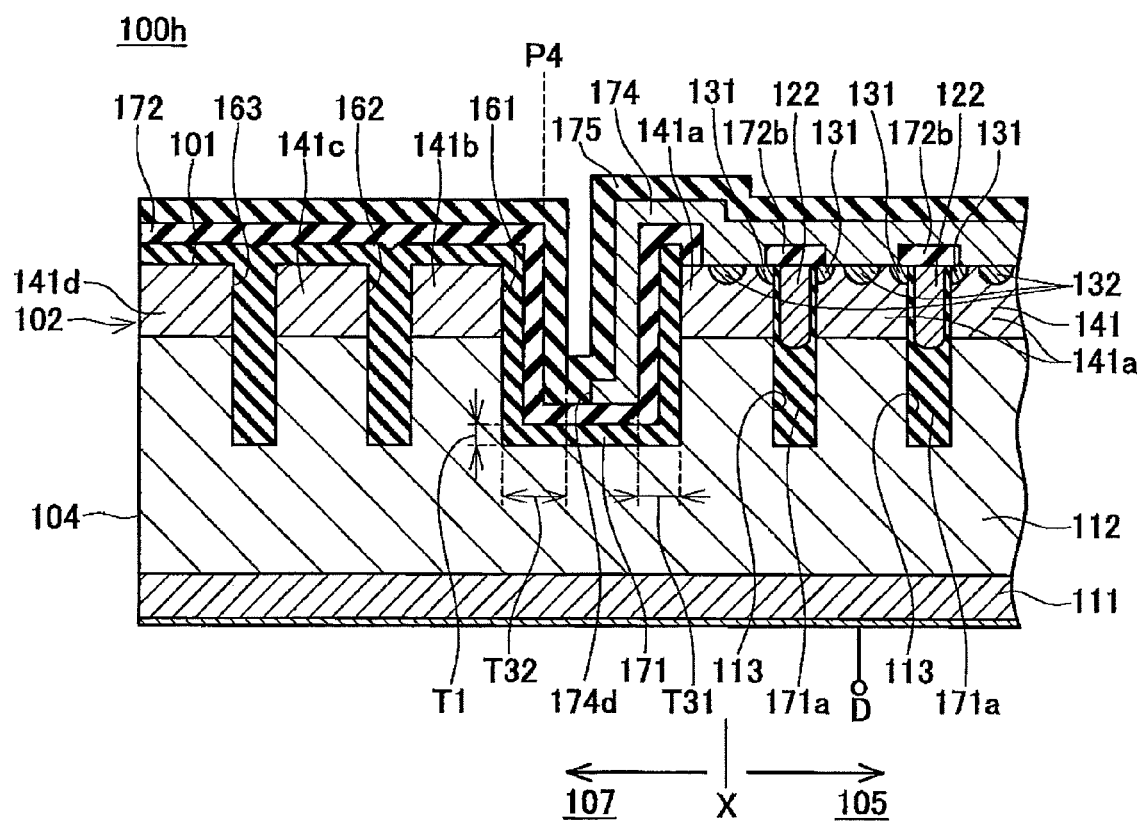
FIG. 18 is a cross-sectional diagram of a semiconductor device according to a fifth embodiment of the present application.

A semiconductor device 100h relating to a fifth embodiment is now described in detail. As shown in FIG. 18, in the semiconductor device 100h, the sidewalls and the bottom surface of a termination trench 161 are covered with an oxide film 171 and an interlayer insulating layer 172. Furthermore, upper portions of main trenches 113 are covered with interlayer insulating layers 172b. A metal film 174 is formed so as to cover, in continuous fashion, the termination trench 161, a surface of a body region 141a in a region to the inner circumference side of the termination trench 161, and surfaces of the interlayer insulating layers 172b which cover the main trenches 113. Furthermore, the metal film 174 is connected to a source electrode (not illustrated) and a source voltage is applied thereto.

A position of forming the metal film 174 on the termination trench 161 is now described. An end portion 174d is formed in the metal film 174. Here, when the semiconductor device 100h is observed from vertically above, the position of the surface of the interlayer insulating layer 172 which covers the sidewall on the chip outer side of the termination trench 161 (the side of the termination area 107) is defined as position P4. The position of the end portion 174d is to the chip inner side from the position P4.

Moreover, the surface of the metal film 174 formed on the sidewalls of the termination trench 161, the surface of the metal film 174 formed on the bottom surface of the termination trench 161, the end portion 174d, and the surface of the interlayer insulation layer 172 which covers the bottom surface of the termination trench 161 in the region to the chip outer side from the end portion 124d are all covered by an insulating layer 175. The insulating layer 175 is a layer for protecting the surface of the semiconductor device 100h from external scratches. One example of the insulating layer 175 is a polyimide film. The internal structure and other structure shown in FIG. 18 are similar to the internal structure in FIG. 17 and therefore description thereof is omitted here.

The beneficial effects of the semiconductor device 100h relating to the fifth embodiment of the present application are now described. In the semiconductor device 100h according to the present embodiment, the thickness of the insulating layer in the sidewall portion on the chip outer side of the termination trench 161 is made thicker by the covering provided by the insulating layer 175. More specifically, the thickness T32 of the insulating layer (the oxide film 171, the interlayer insulating layer 172 and the insulating layer 175) in the sidewall portion on the chip outer side of the termination trench 161 is thicker than the thickness T1 and the thickness T31. Therefore, it is possible to diminish the electric field intensity in the insulating layer which covers the sidewall on the chip outer side of the termination trench 161. Consequently, it is possible to increase the withstand voltage of the termination area 107.

Other beneficial effects of the semiconductor device 100h relating to the fifth embodiment are similar to those of the semiconductor device 100b (FIG. 12) relating to the third embodiment, and therefore detailed description thereof is omitted here.

While specific embodiments of the present application have been described in detail above, such description is for illustrative purposes only and is not intended to limit the scope of claims. Techniques described in the claims include various modifications and changes made to the specific examples illustrated above.

Figure 11:
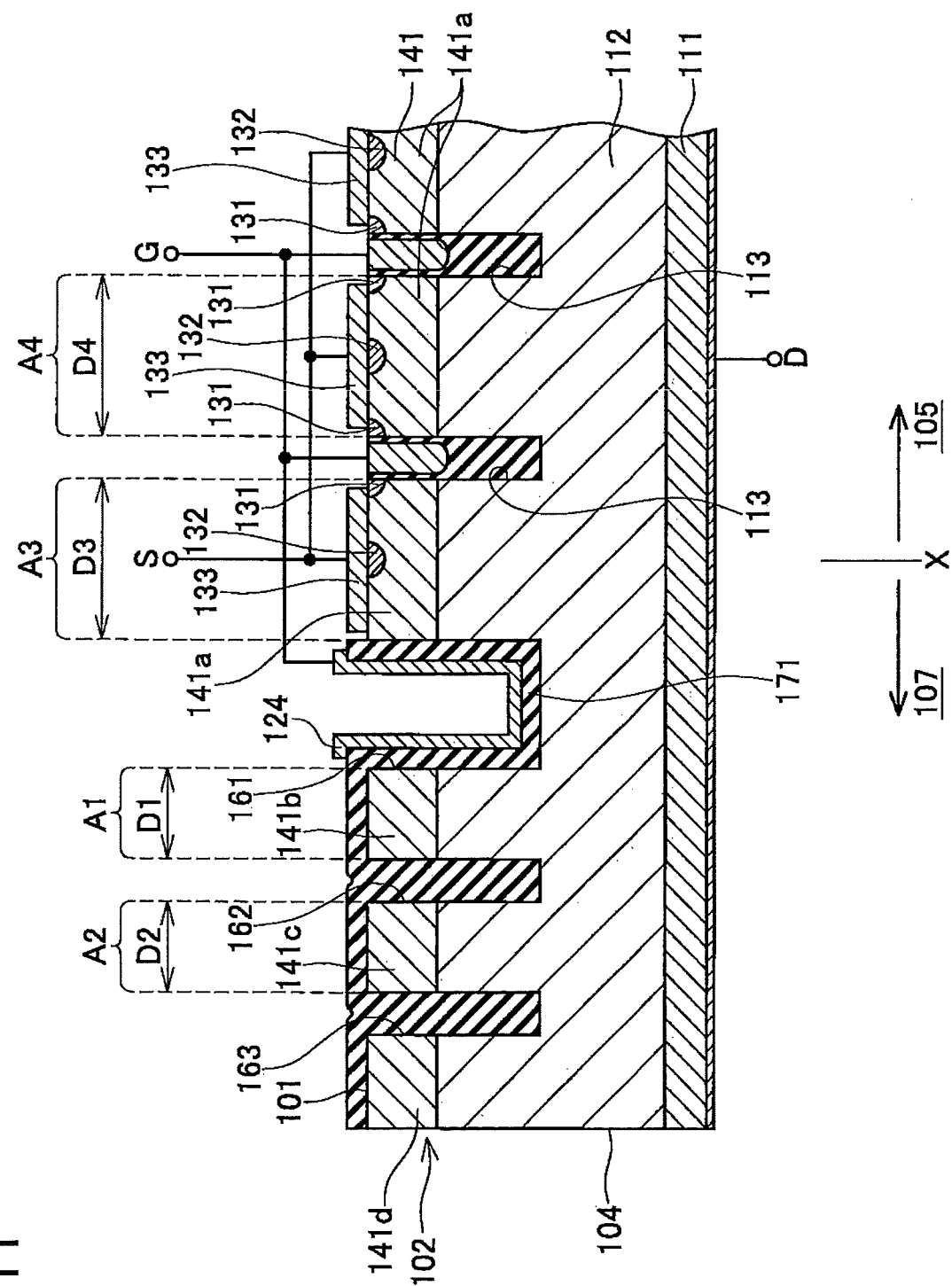
FIG. 11 is a cross-sectional diagram of a modification of the semiconductor device according to the embodiment of the present application.

FIG. 11 shows a modification of the semiconductor device relating to the present application. In FIG. 11, a region between the termination trenches 161 and 162 is defined as region A1. Furthermore, a region between the termination trenches 162 and 163 is defined as region A2. Moreover, widths of the regions A1 and A2 are respectively defined as distances D1 and D2 between termination trenches. Similarly, a region between the termination trench 161 and main trenches 113 is defined as region A3. Furthermore, a region between main trenches 113 is defined as region A4. Moreover, widths of the regions A3 and A4 are respectively defined as distances D3 and D4 between main trenches. In the semiconductor device shown in FIG. 11, the distances. D1 and D2 between termination trenches are smaller than the distances D3 and D4 between main trenches.

In the regions A3 and A4, a body contact region 132 is formed on the surface of a body region 141a. On the other hand, in the regions A1 and A2, no region is formed on the body regions 141b and 141c. Therefore, the depletion layer formed in the semiconductor is less liable to broaden in the regions A1 and A2, than in the regions A3 and A4 where the body contact region 132 is formed. Therefore, by making the distances D1 and D2 between termination trenches smaller than the distances D3 and D4 between main trenches, the depletion layer becomes more liable to broaden in the regions A1 and A2, and the drain-source withstand voltage is raised. Consequently, it is possible to increase the withstand voltage of the termination area 107.

Various methods can be envisaged for malting only the thickness of the insulating film which covers the sidewalls of the termination trench 161 thicker. For example, in the flow shown in FIG. 5, it is possible to add anisotropic etching, such as RIE, after depositing an oxide film 171 on the whole of the surface 101 of the semiconductor substrate 102. Therefore, by etching back, it is possible to make only the oxide film 171 which covers the bottom surface of the termination trench 161 and the oxide film 171 which covers the surface 101 of the semiconductor substrate 102 thin, while keeping a uniform thickness of the oxide film 171 which covers the sidewalls of the termination trench 161.

Furthermore, there are various methods for creating diffusion layers 261 to 263 in the drift region 112. For example, a diffusion layer is formed by epitaxial growth on the surface of a drift region 112. The diffusion layer is then patterned to a shape corresponding to the diffusion layers 261 to 263, by a photo-etching technique. Thereupon, by forming a drift region 112 again by epitaxial growth, it is possible to create diffusion layers 261 to 263 in the drift region 112.

Moreover, it is not necessary to form all of the diffusion layers 261 to 263, and it is possible to form only the diffusion layer 261. Furthermore, it is also possible to form only one of the diffusion layers 262 and 263. Moreover, the diffusion layers 262 and 263 may each respectively contact the body regions 141b and 141c.

Moreover, the technology described in the third embodiment and the technology described in the fourth embodiment may be implemented at the same time. By this, it is possible to raise the withstand voltage of the semiconductor device even further.

The semiconductor used is not limited to SiC. Various other types of semiconductor, such as GaN, GaAs, or the like, may also be used. Moreover, the present embodiment was described with reference to a power MOSFET structure, but is not limited to this mode. Similar beneficial effects can be obtained if the technology according to the present application is applied to an IGBT structure.

In the semiconductor device 100 according to the present application, one termination trench 161 having a buried type field plate structure is formed, but the number is not limited to this. The greater the number of termination trenches 161, the greater the increase in withstand voltage that can be achieved. Furthermore, in the semiconductor device 100 according to the present application, two termination trenches 162 and 163 which are filled with an oxide film 171 are formed, but the number is not limited to this. The greater the number of termination trenches 162 and 163, the greater the increase in withstand voltage that can be achieved. On the other hand, the greater the number of termination trenches 161 to 163, the broader the space occupied by the termination area 107, which is an impediment to making the overall semiconductor device 100 compact in size. Therefore, the number of termination trenches 161 to 163 is desirably specified in accordance with the required withstand voltage.

Furthermore, in each of the semiconductor regions, the P type and N type may be interchanged. Moreover, the insulating region is not limited to an oxide film, and may be various other types of insulating film, such as a nitride film, or a composite film.

The teaching herein is not restricted to forming one semiconductor device 100 on one semiconductor substrate. A plurality of semiconductor devices 100 may be formed on one semiconductor substrate. Alternatively, a semiconductor device 100 and a further semiconductor device may be formed together on one semiconductor substrate. In this case, the termination area 107 is a range which surrounds the cell area 105 forming the semiconductor device 100, and is not necessarily limited to, being a range which extends about the outer circumference of the semiconductor substrate.

Furthermore, it is to be understood that the technical elements described in the present specification and the drawings exhibit technical usefulness solely or in various combinations thereof and shall not be limited to the combinations described in the claims at the time of filing. The techniques illustrated in the present specification and the drawings are to achieve a plurality of objectives at the same time, and technical usefulness is exhibited by attaining any one of such objectives.

The invention claimed is:

1. A semiconductor device comprising:
    a semiconductor substrate of SiC including a cell area and a termination area that surrounds the cell area; wherein
    the cell area is provided with a plurality of main trenches,
    the termination area is provided with a plurality of termination trenches surrounding the cell area,
    the plurality of termination trenches comprise a first termination trench, which is disposed at an innermost circumference, and one or more second termination trenches,
    the one or more second termination trenches are disposed on an outer circumference side of the first termination trench,
    in an inner region of the first termination trench, a first conductive type body region is disposed on a surface of a second conductive type drift region,
    each of the plurality of main trenches penetrates the body region from a surface of the semiconductor substrate and reaches the drift region,
    a gate electrode is provided within each of the plurality of main trenches,
    a bottom surface of each of the plurality of main trenches is covered with a second insulating layer,
    the first termination trench penetrates the body region from the surface of the semiconductor substrate and reaches the drift region,
    sidewalls and a bottom surface of the first termination trench are covered with a first insulating layer,
    the first insulating layer includes at least a covering portion disposed on the bottom surface of the first termination trench,
    at least a part of a surface of the covering portion is covered with a conductive layer,
    a thickness of a portion covering the bottom surface of the first insulating layer is thinner than a thickness of the second insulating layer,
    a depth of the plurality of main trenches is identical to a depth of the first termination trench,
    each second termination trench surrounds the outer circumference of the first termination trench, is narrower than the first termination trench, penetrates the body region from a surface of the body region, and reaches the drift region,
    a particular potential is applied to the conductive layer at least during when no on-potential is applied to the gate electrodes, and
    the particular potential is equal to a potential applied to the gate electrodes or a source electrode when no on-potential is applied to the gate electrodes.

2. The semiconductor device as in claim 1, further comprising a semiconductor region and a contact region, wherein the semiconductor region is formed in a region exposed at the surface of the semiconductor substrate, is a second conductive type region, is disposed adjacent to the main trenches, and is separated from the drift region by the body region, the contact region is formed at a surface of the body region, and electrically connects with the semiconductor region, and no contact region is formed at an outer region of a region surrounded by the first termination trench.

3. The semiconductor device as in claim 1, wherein a depth of the first termination trench is identical to a depth of the second termination trenches.

4. The semiconductor device as in claim 2, wherein a first distance between the first termination trench and a termination trench adjacent to the first termination trench is smaller than a second distance between the first termination trench and a main trench adjacent to the first termination trench.

5. The semiconductor device as in claim 1, wherein
a third insulating layer covers an upper portion of each main trench,
the conductive layer includes aluminum,
the conductive layer continuously covers a surface of the first insulating layer covering the bottom surface and the sidewalls of the first termination trench, a surface of the body region being present in the inner region of the first termination trench, and a surface of the third insulating layer covering the main trenches, and
a potential being equal to a potential applied to the source electrode is applied to the conductive layer.

6. A semiconductor device comprising:
a semiconductor substrate of SiC including a cell area and a termination area that surrounds the cell area; wherein
the cell area is provided with a plurality of main trenches,
the termination area is provided with one or more termination trenches surrounding the cell area,
the one or more termination trenches comprise a first termination trench, which is disposed at an innermost circumference,
in an inner region of the first termination trench, a first conductive type body region is disposed on a surface of a second conductive type drift region,
each main trench penetrates the body region from a surface of the semiconductor substrate and reaches the drift region,
a gate electrode is provided within each main trench,
a bottom surface of each main trench is covered with a second insulating layer,
the first termination trench penetrates the body region from the surface of the semiconductor substrate and reaches the drift region,
sidewalls and a bottom surface of the first termination trench are covered with a first insulating layer,
the first insulating layer includes at least a covering portion disposed on the bottom surface of the first termination trench,
at least a part of a surface of the covering portion is covered with a conductive layer,
a thickness of a portion covering the bottom surface of the first insulating layer is thinner than a thickness of the second insulating layer,
a depth of the plurality of main trenches is identical to a depth of the first termination trench
a particular potential is applied to the conductive layer at least during when no on-potential is applied to the gate electrodes, and
the particular potential is equal to a potential applied to the gate electrodes or a source electrode when no on-potential is applied to the gate electrodes,
wherein a thickness of the first insulating layer covering an outer circumference side of the sidewalls of the first termination trench is thicker than a thickness of the first insulating layer covering an inner circumference side of the sidewalls and the bottom surface of the first termination trench.

7. A semiconductor device comprising:
a semiconductor substrate of SiC including a cell area and a termination area that surrounds the cell area; wherein
the cell area is provided with a plurality of main trenches,
the termination area is provided with one or more termination trenches surrounding the cell area,
the one or more termination trenches comprise a first termination trench, which is disposed at an innermost circumference,
in an inner region of the first termination trench, a first conductive type body region is disposed on a surface of a second conductive type drift region,
each main trench penetrates the body region from a surface of the semiconductor substrate and reaches the drift region,
a gate electrode is provided within each main trench,
a bottom surface of each main trench is covered with a second insulating layer,
the first termination trench penetrates the body region from the surface of the semiconductor substrate and reaches the drift region,
sidewalls and a bottom surface of the first termination trench are covered with a first insulating layer,
the first insulating layer includes at least a covering portion disposed on the bottom surface of the first termination trench,
at least a part of a surface of the covering portion is covered with a conductive layer,
a thickness of a portion covering the bottom surface of the first insulating layer is thinner than a thickness of the second insulating layer,
a depth of the plurality of main trenches is identical to a depth of the first termination trench,
a particular potential is applied to the conductive layer at least during when no on-potential is applied to the gate electrodes, and
the particular potential is equal to a potential applied to the gate electrodes or a source electrode when no on-potential is applied to the gate electrodes,
wherein
the first insulating layer comprises a lower layer insulating layer and an upper layer insulating layer,
the lower layer insulating layer covers the sidewalls and the bottom surface of the first termination trench,
the conductive layer is provided with a first end portion,
the conductive layer is formed at an inner region of the first end portion,
when the semiconductor device is observed from vertically above the semiconductor substrate, the first end portion is positioned on an inner circumference of a surface position of the first insulating layer covering an outer circumference side of the sidewalls of the first termination trench,
the upper layer insulating layer covers a surface of the lower layer insulating layer covering the sidewalls of the first termination trench, a surface and sidewalls of the conductive layer covering the surface of the lower layer insulating layer, and a surface of the lower layer insulating layer covering the bottom surface of the first termination trench at an outer region of the first end portion.

8. The semiconductor device as in claim 7, wherein
a distance between a surface of the lower layer insulating layer covering an outer circumference side of the sidewalls of the first termination trench and the first end portion of the conductive layer is a distance in which a region between the surface of the lower layer insulating layer covering the outer circumference side of the sidewalls of the first termination trench and the first end portion of the conductive layer is filled without any voids by the upper layer insulating layer covering the conductive layer.

9. The semiconductor device as in claim 8, wherein
the distance between the surface of the lower layer insulating layer covering the outer circumference side of the sidewalls of the first termination trench and the first end portion of the conductive layer is twice a thickness of the upper layer insulating layer covering the conductive layer.

10. The semiconductor device as in claim 1, wherein
a third insulating layer covers an upper portion of each main trench,
the conductive layer includes aluminum,
the conductive layer is provided with a first end portion,
the conductive layer is disposed in an inner region of the first end portion,
when the semiconductor device is observed from vertically above the semiconductor substrate, the first end portion is positioned on an inner circumference of a surface position of the first insulating layer covering an outer circumference side of the sidewalls of the first termination trench,
the conductive layer continuously covers a surface of the first insulating layer covering the bottom surface and sidewalls of the first termination trench, a surface of the body region being present in inner region of the first termination trench, and a surface of the third insulating layer covering the main trenches,
a potential being equal to a potential applied to the source electrode is applied to the conductive layer, and
a fourth insulating layer covers a surface of the first insulating layer covering the sidewalls of the first termination trench, a surface and sidewalls of the conductive layer covering the surface of the first insulating layer, and a surface of the first insulating layer covering the bottom surface of the first termination trench at an outer region of the first end portion.

11. The semiconductor device as in claim 10, wherein
a distance between a surface of the first insulating layer covering an outer circumference side of the sidewalls of the first termination trench and the first end portion of the conductive layer is a distance in which a region between a surface of the first insulating layer covering the outer circumference side of the sidewalls of the first termination trench and the first end portion of the conductive layer is filled without any voids by the fourth insulating layer covering the conductive layer.

12. The semiconductor device as in claim 1, wherein
a second end portion of the conductive layer is formed at the surface of the semiconductor substrate and near an opening portion of the first termination trench, and
when the semiconductor device is observed from vertically above the semiconductor substrate, the second end portion of the conductive layer disposed on an outer region of the first termination trench is positioned on an inner circumference of an outer circumference side of the sidewalls of the first termination trench.

13. The semiconductor device as in claim 1, wherein
a first conductive type first diffusion layer is formed on at least a part of the drift region disposed on the bottom surface of the first termination trench.

14. The semiconductor device as in claim 1, further comprising a plurality of the second termination trenches.

15. The semiconductor device as in claim 13, wherein the first diffusion layer comprises a third end portion,
the first diffusion layer is formed at an inner region of the third end portion, and
when the semiconductor device is observed from vertically above the semiconductor substrate, the third end portion is positioned on an outer circumference side of the outer circumference side of the sidewalls of the first termination trench.

16. The semiconductor device as in claim 13, wherein
the first diffusion layer comprises a fourth end portion,
the first diffusion layer is formed at an outer region of the fourth end portion, and
when the semiconductor device is observed from vertically above the semiconductor substrate, the fourth end portion is positioned on an outer circumference side of the inner circumference side of the sidewalls of the first termination trench.

\* \* \* \* \*